United States Patent [19]

Abe et al.

[11] 4,401,539

[45] Aug. 30, 1983

[54] SPUTTERING CATHODE STRUCTURE FOR SPUTTERING APPARATUSES, METHOD OF CONTROLLING MAGNETIC FLUX GENERATED BY SAID SPUTTERING CATHODE STRUCTURE, AND METHOD OF FORMING FILMS BY USE OF SAID SPUTTERING CATHODE STRUCTURE

[75] Inventors: Katsuo Abe, Yokosuka; Shigeru Kobayashi, Kawasaki; Tsuneaki Kamei, Kanagawa; Hideki Tateishi; Susumu Aiuchi, both of Yokohama, all of Japan

[73] Assignee: Hitachi, Ltd., Tokyo, Japan

[21] Appl. No.: 343,858

[22] Filed: Jan. 29, 1982

[30] Foreign Application Priority Data

Jan. 30, 1981 [JP] Japan .................................. 56-11682
Jun. 29, 1981 [JP] Japan .................................. 56-99659
Jun. 29, 1981 [JP] Japan .................................. 56-99660

[51] Int. Cl.³ .............................................. C23C 15/00
[52] U.S. Cl. .................................. 204/192 R; 204/298
[58] Field of Search ............................ 204/298, 192 R

[56] References Cited

U.S. PATENT DOCUMENTS

| | | | |
|---|---|---|---|
| 3,956,093 | 5/1976 | McCleod | 204/298 |
| 4,060,470 | 11/1977 | Clarke | 204/298 |
| 4,162,958 | 7/1979 | Morrison | 204/192 R |
| 4,169,031 | 9/1979 | Brors | 204/192 R |
| 4,175,030 | 11/1979 | Love et al. | 204/298 |
| 4,180,450 | 12/1979 | Morrison | 204/192 R |
| 4,198,283 | 4/1980 | Class et al. | 204/192 R |
| 4,239,611 | 12/1980 | Morrison | 204/192 R |
| 4,265,729 | 5/1981 | Morrison | 204/192 R |
| 4,282,083 | 4/1981 | Kertesz et al. | 204/298 |

FOREIGN PATENT DOCUMENTS 51-86083 12/1975 Japan .
53-7586 2/1978 Japan .

OTHER PUBLICATIONS

Waits J. Vac. Sci. Technol., 15 (1978), pp. 179-187.

Primary Examiner—Arthur P. Demers
Attorney, Agent, or Firm—Antonelli, Terry & Wands

[57] ABSTRACT

A sputtering apparatus of the planar magnetron type is disclosed, in which a low-pressure gas is ionized by glow discharge, ions in the plasma are accelerated by a voltage applied between a cathode and an anode to bombard a target structure, atoms or particles of a target material sputtered from the planar target plate by the bombardment of ions are deposited on a substrate disposed on the anode side, and thus a thin film made of the same material as the target material is formed on the substrate. In view of the facts that lines of magnetic flux generated by a single magnetic flux source does not link each other and the Maxwell stress, the target structure includes the planar target plate and a magnetic flux source having at least three pole pieces in an arrangement that the planar target plate is disposed between the anode and the magnetic flux source, and the amount of magnetic flux starting from a portion of the pole pieces is controlled to control the amount of magnetic flux (or the flux density) existing at the remaining pole pieces and the magnetic flux distribution above the planar target plate, thereby controlling the position of a region where the plasma is formed.

40 Claims, 36 Drawing Figures

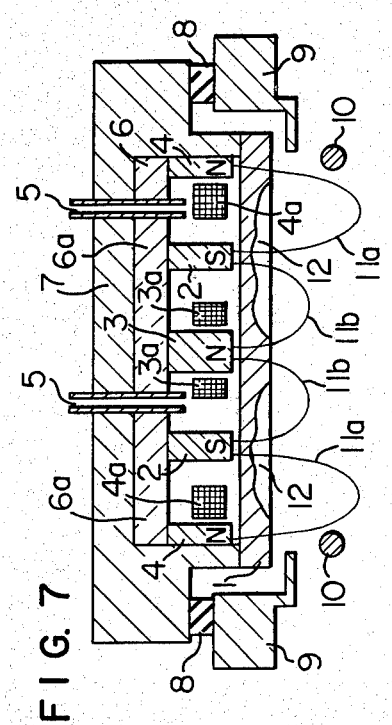
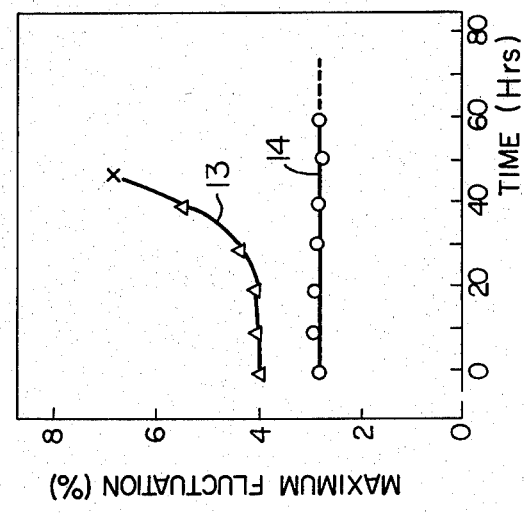
FIG. 22a
FIG. 22b
FIG. 23a
FIG. 23b
FIG. 7
FIG. 8

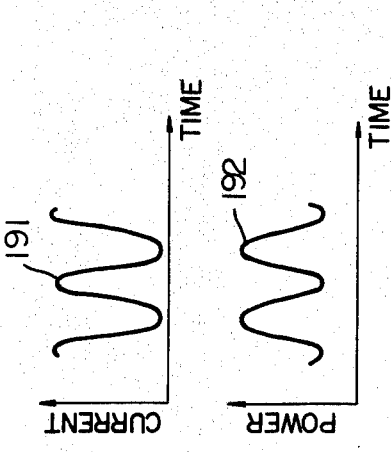
FIG. 27
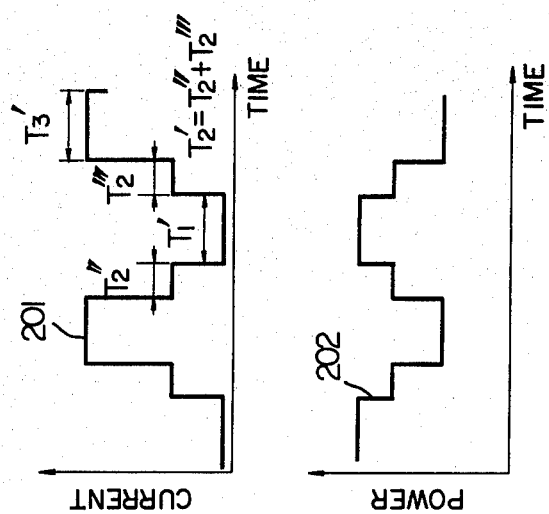
FIG. 29a
FIG. 29b
FIG. 30a
FIG. 30b
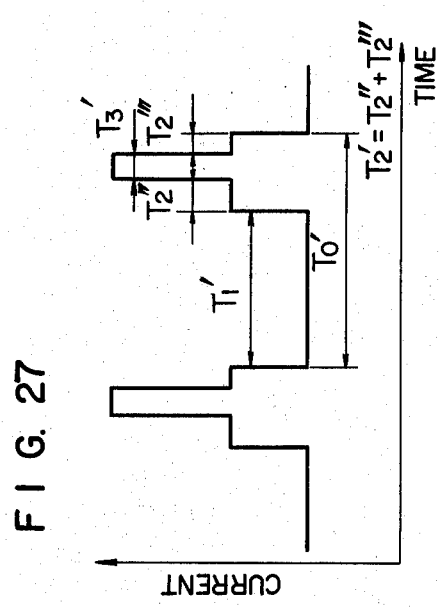
FIG. 28a
FIG. 28b
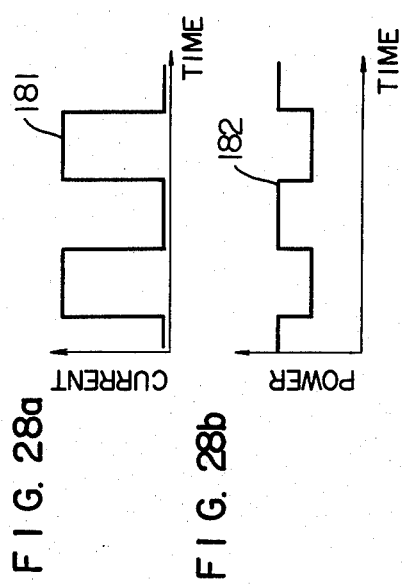

SPUTTERING CATHODE STRUCTURE FOR SPUTTERING APPARATUSES, METHOD OF CONTROLLING MAGNETIC FLUX GENERATED BY SAID SPUTTERING CATHODE STRUCTURE, AND METHOD OF FORMING FILMS BY USE OF SAID SPUTTERING CATHODE STRUCTURE

BACKGROUND OF THE INVENTION

1. FIELD OF THE INVENTION

The present invention relates to a sputtering cathode structure for sputtering apparatuses of the planar magnetron type which can increase the life of a planar target plate for sputtering a film material and can control the thickness distribution of a film deposited on a substrate. Further, the present invention relates to a method of controlling magnetic flux generated in the target structure, and to a method of forming films by the use of the target structure.

2. DESCRIPTION OF THE PRIOR ART

In the sputtering technique, a low-pressure gas, e.g. argon, in a space is ionized by glow discharge to form a plasma, and ions in the plasma are accelerated by an electric field generated by a voltage applied between a cathode and an anode to bombard a planar target plate placed on the cathode. Atoms or particles sputtered from the target plate by the bombardment of ions are successively deposited on a substrate place in the vicinity of the anode to form a thin film of a target material.

In this case, in order to assure good qualities for the film deposited on the substrate, to improve the rate of deposition, and to lower the damage to the substrate by electrons, it is important to confine ions and electrons generated by glow discharge in a limited space to a high density, and to effectively transfer the ions in the limited space to the planar target plate.

Therefore, various magnetic field configurations have been studied which can confine the ions in a limited space above the planar target plate to obtain high ion and electron densities.

In recent years, a planar magnetron sputtering apparatus has attained nearly equal deposition rate to that of a conventional resistance heating type vacuum evaporation apparatus, and therefore is widely used in a film forming process for mass production of this films for use in thin film integrated circuits and semi-conductor devices. A recent technical trend of planar magnetron sputtering apparatuses is described in, for example, an article by Waits entitled "Planar magnetron sputtering", J. Vac. Soc. Technol. 15 (2), March/April, 1978, pp. 179 to 187.

FIG. 1 is a cross sectional view for explaining an outline of a structure including a planar target material plate and its peripheral members, namely, a sputtering cathode structure of a well-known conventional planar magnetron sputtering apparatus. In this conventional sputtering apparatus, a ring-shaped magnetic pole portion 2 and a columnar magnet 3 placed at a central part of the magnetic pole ring 2 are magnetically coupled by a yoke 6 on the back side of a planar target material plate 1 (hereinafter referred to as "planar target plate") to form a magnetic circuit. A distribution of lines of magnetic force is established, by the magnetic poles at the pole portions 2 and 3, in a space on the surface side of the planar target plate 1 (in FIG. 1 on the lower side of the plate 1). In more detail, there is established a magnetic field distribution which has such a form as obtained by bisecting a torus by a plane perpendicular to the axis of the torus and by placing the bisecting plane parallel to the surface of the plate 1. In other words, a so-called tunnel-shaped magnetic field distribution 11 is generated. Electrons (not shown) generated by glow discharge are confined in the tunnel-shaped magnetic field distribution 11 so that a high ion density is obtained. The ions are accelerated by an electric field which is approximately perpendicular to the surface of the planar target plate 1 and is generated by a voltage applied between a ring-shaped anode 10 and a disc-like cathode 7, to bombard the surface of the target plate 1. The anode 10 may be directly connected to a directly grounded shield 9 or may be slightly positively biased. As a result, atoms or particles of the target material are successively sputtered from the surface of the target plate 1. Thus, an erosion region 12 is formed in the surface of the plate 1. Incidentally, the cathode body 7 is disposed on the back side of the planar target plate 1 and is electrically connected to a negative high voltage source, and the anode 9 is fixed to the cathode 7 through an insulating spacer 8. Further, reference numeral 5 designates a water cooling mechanism.

As can be seen from the above-mentioned explanation, erosion proceeds with the elapse of time in a sputtering process, and thus the erosion region 12 is formed. In the sputtering cathode structure shown in FIG. 1, the above-mentioned erosion proceeds only in a specified region of the planar target plate, and therefore only a portion of the planar target plate corresponding to the erosion region is used to form a deposited film.

Owing to the erosion region formation mechanism, although a film having a uniform thickness can be obtained in an initial stage, the amount of atoms sputtered from the planar target plate and the direction in which the target material is sputtered, vary with the elapse of time, and therefore the thickness of a film deposited on a substrate (not shown) is not uniform when the erosive action has proceeded. That is, a film which is deposited on the substrate when the erosive action has proceeded, has a thickness distribution having a cross-sectional form of an upwardly convex curve with a central part being downwardly convex, i.e. saddle-like shape as explained later. Accordingly, it is not possible to obtain a deposited film having a desired thickness distribution, e.g. uniform distribution.

In the case where a film having a large thickness is required, or in the case where it is required to perform a long-time sputtering operation which is important from the practical point of view, the planar target plate of the conventional planar magnetron sputtering apparatus cannot be employed due to the above-mentioned localized erosion in the planar target plate and a nonuniform distribution of thickness of a deposited film. That is, the conventional sputtering process is restricted in operating time. In order to eliminate the above-mentioned drawbacks, it has been proposed to vary the magnetic field distribution 11 so that the erosion region 12 is formed in a large surface portion of the planar target plate 1 (refer to U.S. Pat. No. 3,956,093).

The theoretical background or technical thought of this proposal, as is described in column 1, lines 53 to 57 to U.S. Pat. No. 3,956,093, resides in that maximum target erosion is generated at a region substantially aligned with and underlying the point or region over which magnetic flux lines are parallel to the target plate. In more detail, an apparatus is claimed in claim 3 of the above-referred patent which comprises anode means spaced from a planar sputtering source for establishing an electrostatic field therebetween, first magnet means for providing flux lines exiting the source and returning thereto along a curved path thereby defining an erosion region on the source in a closed loop configuration, second magnet means adapted to produce an auxiliary, variable magnetic field in a direction substantially normal to the source in the presence of the flux lines such that upon variation of the variable magnetic field, the location at which resultant flux lines are generally parallel to the source is continuously translated across the erosion region whereby the source is eroded to a generally uniform depth substantially throughout the erosion region. Further, an embodiment in which an electromagnet serving as the second magnet means is arranged separately, is disclosed in the above patent. Besides, a Japanese Patent Application Laid-open Specification (No. 7586/1978) discloses a technique in which magnet means itself is moved mechanically.

The present inventors have restudied the technical thought and technical means disclosed in the patent and laid-open specification with reference to experimental facts which were obtained by the present inventors. As a result thereof, a sputtering cathode structure and a method of controlling magnetic flux generated in the sputtering cathode structure have been obtained which can enhance the effect obtained by the technical means disclosed in the patent and laid-open specification. Further, a technique has been obtained which can freely control the thickness distribution of a deposited thin film.

SUMMARY OF THE INVENTION

An object of the present invention is to provide a sputtering cathode structure for planar magnetron sputtering apparatuses which eliminates the above-mentioned drawbacks of the prior arts and increases the life of a planar target plate, which enables a continuous sputtering process, a long-time sputtering process and an automatic sputtering process.

Another object of the present invention is to provide a sputtering cathode structure for planar magnetron sputtering apparatuses which eliminates the above-mentioned drawbacks of the prior arts, increases the life of a planar target plate, and furthermore can control the thickness distribution of a deposited thin film.

A further object of the present invention is to provide a method of controlling magnetic flux which can control a plasma region formed in a space above a planar target plate during a sputtering process, to eliminate the above-mentioned drawbacks of the prior art, to increase the life of the planar target plate, and to control the thickness distribution of a deposited thin film.

Still another object of the present invention is to provide a method of forming a film through the planar magnetron sputtering technique which eliminates the above-mentioned drawbacks of the prior arts, can make uniform the thickness of a deposited film, and can facilitate the practical use.

According to an aspect of the present invention, there is provided a sputtering cathode structure adapted for use in a planar magnetron sputtering comprising:
  at least two magnet means for generating magnetic flux, including at least one electromagnet coil to be energized by a controlled current;
  means for magnetically coupling said at least two magnet means to form an integrated magnetic flux source together with said at least two magnet means, including a magnetic member bridging said at least two magnet means and formed of a soft magnetic material; and
  means for supplying a controlled current to said at least one electromagnet coil for generating controlled magnetic flux, thereby controlling the distribution of magnetic flux at least in the neighborhood of said integrated magnetic flux source.

For example, the integrated magnetic flux source is preferably provided with a magnetic enclosure which surrounds the magnet means and works to limit the maximum envelope of the substantial flux distribution. It can be considered that, in the integrated magnetic flux source, the location and distribution of generation and sinking of magnetic flux lines can be widely varied by changing the polarity and the magnitude of the exciting current for the electromagnet.

Another aspect of the present invention is to provide a sputtering cathode structure for planar magnetron sputtering apparatuses in which, in view of the facts that lines of magnetic flux generated by a single flux source don't cross or link each other and respective positions of the lines of magnetic flux can be moved by the action of the Maxwell stress, namely, attraction or repulsion between the lines of magnetic flux, a flux source having at least three pole pieces is provided, and the amount of magnetic flux starting from a portion of the pole pieces is controlled to vary the density of magnetic flux existing at the remaining pole pieces and the place where magnetic flux is distributed, thereby moving a region where a plasma is present.

Namely, when another magnetic flux source is introduced into an existing field, the distribution of the magnetic flux all over the fields is changed into a new one. The change of the flux distribution is enhanced by the integral structure of the flux source. The new flux source is not limited to be one and may be more than one or may be distributed.

Further aspect of the present invention is to provide a method of controlling magnetic flux generated in a sputtering cathode structure for planar magnetron sputtering apparatuses, in which method a flux source having at least three pole pieces is provided in a sputtering cathode structure, and a controlled direct current or a periodically varying current is caused to flow through exciting means attached to at least one of the pole pieces during a sputtering process, to move a plasma region with time, thereby forming or controlling a flux distribution so that the life of a planar target plate is increased and the thickness distribution of a deposited film can be controlled.

Another aspect of the present invention is to provide a sputtering method using a planar magnetron sputtering apparatus which is based on the facts that lines of magnetic flux generated by a single flux source don't link each other and respective positions of the lines of magnetic flux can be moved by the action of the Maxwell stress, namely, attraction or repulsion between the lines of magnetic flux, and which is provided with a flux source having at least three pole pieces. The amount of magnetic flux existing at a portion of the pole pieces is controlled to vary the amount of magnetic flux starting from the remaining pole pieces and the place where magnetic flux is distributed, thereby moving a region where a plasma is present. In this sputtering method, a current which varies in magnitude at a predetermined period is caused to flow through an electromagnet coil provided for at least one of the pole pieces during a sputtering period, to move a ring-shaped plasma region at least once within the predetermined period. Thus, different layers are deposited from two positions of the target below the plasma generating region, and these deposited layers are synthesized to compose a single film.

Another aspect of the present invention is to provide a planar magnetron sputtering apparatus in which, in view of the facts that lines of magnetic flux generated by a single flux source don't link each other and respective positions of the lines of magnetic flux can be moved by the action of the Maxwell stress, namely, attraction or repulsion between the lines of magnetic flux, at least three pole pieces are integrated to constitute a flux source and the amount of magnetic flux existing at a portion of the pole pieces is controlled to vary the amount of magnetic flux associated the remaining pole pieces and the place where magnetic flux is distributed, thereby moving a region where a plasma is present, readily and widely. In this planar magnetron sputtering apparatus, a varying current having a predetermined period is caused to flow through an electromagnet provided for at least one of the pole pieces during a sputtering process, and an electric power for performing a sputtering operation is simultaneously increased or decreased in synchronism with the above-mentioned current to increase or decrease the amount of sputtered material while moving a ring-shaped plasma generating region at least once at the predetermined period. Thus, different layers are deposited from two positions of the ring-shaped plasma generating region, and these layers constitute a single film.

BRIEF DESCRIPTION OF THE DRAWINGS

FIGS. 6 and 7 are sectional views for explaining the operation of the embodiment shown in FIG. 5.

FIG. 8 is a graph showing relations between a time during which a planar target plate has been used in sputtering process and variations of the maximum fluctuation of film thickness distribution within a substrate with the eplase of time, for the case where a conventional target structure is employed and the case where a sputtering cathode structure according to the present invention is employed.

FIG. 9b is a transverse sectional view of the embodiment shown in FIG. 9a.

FIGS. 22a, 22b, 23a and 23b are diagrammatic views for explaining that the thickness distribution of a film varies as erosion proceeds on a target.

FIG. 27 shows an example of the waveform of a control current which is supplied to the outer electromagnet coil to deposit a film in a large area of a substrate.

FIG. 28a shows an example of the waveform of a current which is caused to flow through the outer electromagnet.

FIG. 28b shows a waveform of electric power supplied to a sputtering cathode for carrying out sputtering.

FIG. 29a shows another example of current waveform different from the example shown in FIG. 28a.

FIG. 29b shows a waveform of electric power for sputtering, which corresponds to the waveform shown in FIG. 29a.

FIG. 30a shows a further example of current waveform for energizing an electromagnet coil.

FIG. 30b shows a waveform of electric power for sputtering, which corresponds to the waveform shown in FIG. 30a.

DESCRIPTION OF THE PREFERRED EMBODIMENTS

Now, various embodiments of the present invention will be explained below in detail with reference to the drawings.

Figure 2:
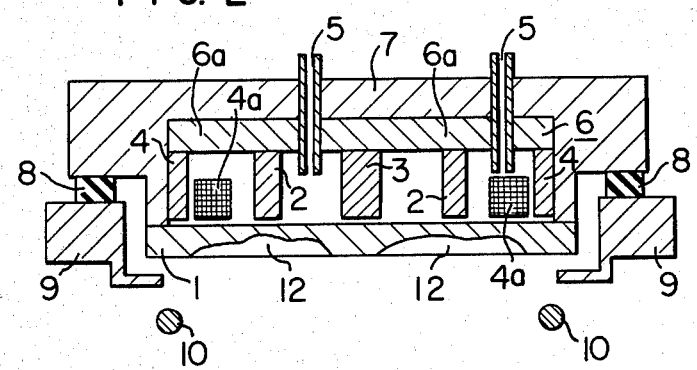
FIG. 2 is a cross sectional view for showing an outline of an embodiment of a sputtering cathode structure according to the present invention which is suitable for use in planar magnetron sputtering apparatuses.

FIG. 2 is a sectional view for showing an outline of an embodiment of a sputtering cathode structure according to the present invention which is suitable for use in planar magnetron sputtering apparatuses. Reference numeral 1 in FIG. 2 designates a disk-shaped planar target plate made of a sputtered material, for example, an aluminum alloy, which contains 2% silicon and the purity of which is 99.999%, and having a diameter of about 20 cm and a thickness of 20 mm, 2 a first pole portion made of a soft magnetic material (namely, a magnetic material with a high permeability) and having the form of a hollow circular cylinder, 3 a second pole portion formed of a permanent magnet and having the form of a column for forming an integrated flux generating means together with the first pole portion 2, 4 a third pole portion which is made of a soft magnetic material and has the form of a hollow circular cylinder, 4a an exciting coil having the coil winding of a form of a hollow circular cylinder, and is disposed in a space between the first and third pole portions 2 and 4 to provide flux distribution control means, 5 an inlet and an outlet for supplying and discharging coolant for cooling the planar target plate 1 such as water, 6 first flux path means made of a soft magnetic material, that is, a yoke for magnetically integrating the first, second and third pole portions on the whole, 6a a yoke made of a soft magnetic material for forming second flux path means, 7 a cathode body, 8 an insulating spacer plate, 9 a grounded shield, 10 an anode which is directly grounded or biased to some positive value of 0 to +20 volts, and 12 an erosion region.

Figure 3:
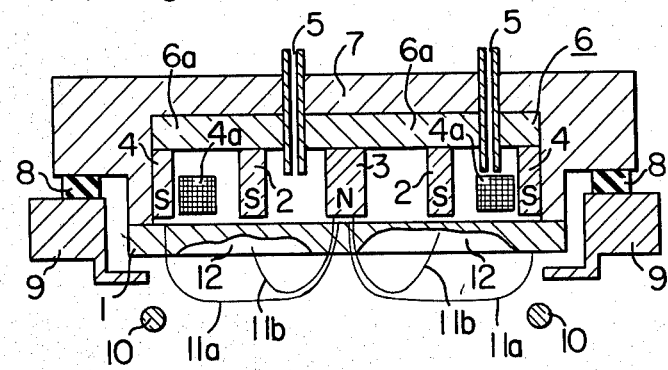
FIGS. 3 and 4 are cross sectional views for explaining the operation of the embodiment shown in FIG. 1.

Shown in FIG. 3 is a cross sectional view for explaining the operation of the sputtering cathode structure shown in FIG. 2, and FIG. 3 shows the case in which the first, second and third pole portions (reference numerals 2, 3 and 4) for forming the integrated flux generating means (and with the third pole portion concurrently contributing as a flux distribution control means) have S, N and S poles as their tips, respectively. It is well-known that these polarities represent the relatively polarity to each other.

Figure 4:
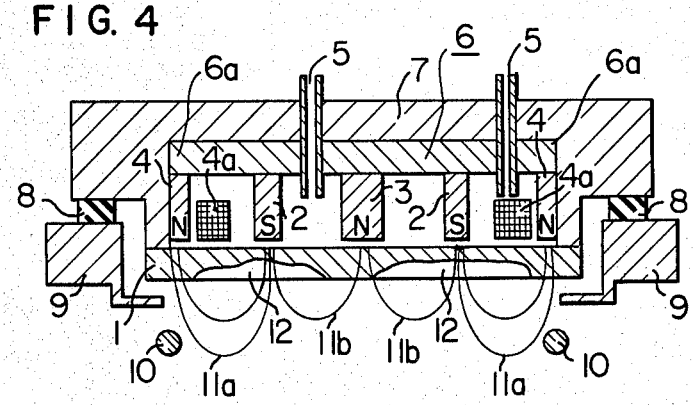

FIG. 4 illustrates a flux distribution when the exciting current for the outer winding is reversed. Similar reference symbols represent similar parts. In this case, the magnetic flux exiting from the second pole portion (namely, permanent magnet) passes through the yoke 6, and is then dispersed into two parts, one of which exits the S pole of the first pole portion 2 and enters the N pole of the second pole portion 3 in such a manner that a well-known flux diagram is produced, and the other of which exits from the N pole of the third pole portion 4 and enters the S pole of the second pole portion 2 in a similar manner. That is, the above-mentioned magnetic flux forms such a flux distribution as indicated by representative lines of magnetic flux 11a and 11b. However, the whole flux distribution, that is, the form at which the whole lines of magnetic flux are distributed, can be controlled by a control current (not shown) flowing through the outer coil winding 4a associated with the third pole portion 4. Although such a magnetic flux distribution can be obtained by a well-known calculation with respect to magnetic circuit, it can be obtained by experiments directly and more readily.

It will be made clear by the following explanation of sputtering process how the magnetic flux distribution region performs its role in a sputtering process.

First, a sputtering cathode structure according to the present invention is fixed to one wall of a vaccum chamber (not shown) which is provided with an evacuating system, a shutter, an argon gas introducing system, two gate valves, and means for successively carrying wafers (substrates). Next, a silicon wafer (having a diameter of about 10 cm) is held parallel to the surface of the planar target plate 1, by well-known holding means, at a place above the target plate 1 (in an arrangement obtained by turning the sputtering cathode structure of FIG. 4 upside down), so that the silicon wafer is spaced 65 mm apart from the surface of the target plate 1 and a region where the lines of magnetic flux 11a and 11b are formed, is placed between the silicon wafer and the target plate 1. Thereafter, the vacuum chamber is evacuated to a pressure of 1 to $3 \times 10^{-7}$ Torr, and then argon gas is introduced into the vacuum vessel through the argon gas introducing system so that the vacuum chamber is filled with argon gas at a pressure of 1 to 10 mTorr. Then, a control current is forced to flow through the outer coil winding 4a of the sputtering cathode structure, and the amount and direction of the control current are adjusted so that a flux density of 0.025 to 0.038 Wb/m² which is parallel to the planar target plate is obtained and a predetermined flux distribution is produced.

Next, a d.c. voltage of 300 to 700 V is applied between the anode 10 and cathode 7 of the sputtering cathode structure to generate glow discharge in argon gas, and thus a plasma region, in which argon ions and electrons are confined, is formed at such a region as indicated by the lines of magnetic flux 11a and 11b. In the sputtering cathode structure, the diameter of a torus plasma region in which argon ions and electrons are confined, can be decreased or increased. This can be visually and experimentally confirmed by changing the magnitude and direction of the control current.

Next, after the shutter (not shown) for the sputtering cathode structure has been closed in order to inhibit deposition of the target material on to the substrate, sputtering is carried out for about 30 minutes. This process is refered to as "pre-sputtering" hereafter. Then, the shutter is opened, and sputtering is carried out at a sputtering rate of about 7000 A/min till an Al-2%Si film is deposited to a thickness of about 1 μm. After a predetermined deposition time has elapsed, the shutter is closed and the one gate valve is opened to take out the silicon wafer having a deposited Al-2%Si film, and the new wafer is introduced through the another gate valve. The above-mentioned process without the pre-sputtering has been repeated a large number of times, and films have been formed in the above-mentioned manner for more than 60 hours in order to evaluate the performance of the cathode structure.

FIG. 8 shows a typical part of the experimental results. In FIG. 8, the curve B indicates a relation between variations in the maximum fluctuation of the film thickness distribution within the wafers and a time during which the target plate has been used in sputtering, in the case where a conventional sputtering cathode structure is employed, and the curve 14 indicates the above-mentioned relation in the case where a sputtering cathode structure according to an embodiment of the present invention is employed under the conditions that the diameter of a torus plasma has been changed at every ten hours to be from $\phi 85$ mm to $\phi 100$ mm by 3 mm step consecutively in process of time.

As is apparent from FIG. 8 the present invention produces a remarkable effect, that is, much reduction in variations of film thickness distribution on substrates. Further, the Al-2%Si films formed by the use of the target structure according to an embodiment of the present invention exhibit an excellent electric characteristic when used as a wiring film in semiconductor devices.

Figure 1:
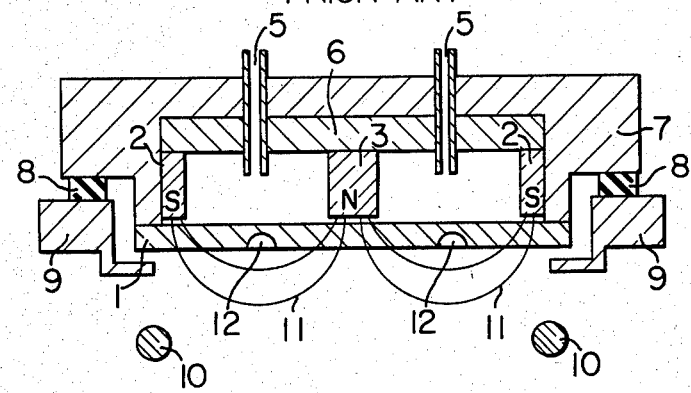
FIG. 1 is a cross sectional view for showing an outline of a sputtering cathode structure in a conventional planar magnetron sputtering apparatus.

It has been made clear by the inventors' study that such a favorable thickness distribution of each deposited film is strongly dependent upon the shape of an erosion region formed in that surface of the planar target plate 1 which confronts the silicon wafer. In the conventional planar magnetron sputtering cathode structure shown in FIG. 1, the erosion region 12 is very narrow, like a V-shaped steep valley, and moreover erosive action is increasingly localized with the lapse of time. That is, erosion proceeds preferentially at the tip of the erosion region 12 (the bottom of an erosion valley), and finally the depth of the erosion region becomes equal to the thickness of the planar target plate 1, which makes it impossible to use the planar target plate 1.

On the other hand in the sputtering cathode structure shown in FIG. 2, an area where the lines of magnetic flux are parallel to the planar target plate 1 is able to be controlled to be in region between a central portion and circumferential portion of the planar target plate 1 by applying an appropriately controlled current to the outer coil winding 4, and therefore the resultant erosion region 12 can be made relatively wide and be formed at relatively large area.

It may be noted that the locations of flux lines crossing the target can be widely varied according to the present structure.

Another mode of operation for the structure of FIG. 4 will be explained below.

The magnitude and the polarity of the control current flowing through the outer coil winding 4a is changed at a predetermined time interval in such a manner that the control current has a predetermined amplitude in function of time so that a diameter of a torus plasma can be increased or decreased periodically with the predetermined time interval. By repeating the above process, that is, to decrease and increase the diameter of the torus plasma periodically, for at least once (or more times) within a time required for forming a predetermined film thickness, e.g. 1 μm, a film is deposited on a wafer. Thus a uniform erosion region is able to be formed on the surface of a planar target plate 1.

The formation of the uniform erosion region increases the utilization efficiency and thus makes the life of the expensive target plate 1 longer, and produces an excellent effect that a dead time which is based mainly upon the replacement of the target plate 1 and causes a bottleneck in sputtering process, is reduced.

Figure 5:
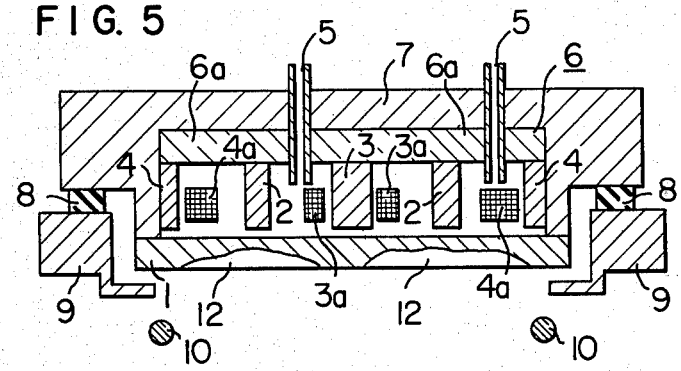
FIG. 5 is a sectional view for showing an outline of another embodiment of a target structure according to the present invention which is suitable for use in planar magnetron sputtering apparatuses.

FIG. 5 is a cross-sectional view for showing an outline of another embodiment of a sputtering cathode structure, which is used in planar magnetron sputtering apparatuses. The embodiment shown in FIG. 5 is different from the embodiment shown in FIG. 2 in that the second pole portion 3 is not formed of a permanent magnet but formed of a soft magnetic material, and is provided with a second exciting coil 3a which is referred to "inner coil" hereafter. Other reference numerals designate like parts in FIGS. 2 to 4.

The technical thought of the present invention includes such a structure as shown in FIG. 5. The operation of the embodiment shown in FIG. 5 is different from the operation of the embodiment shown in FIGS. 2 and 4 in that magnetic flux generated by the second pole portion 3 and magnetic flux generated by the third pole portion 4 can be simultaneously controlled due to the above-mentioned structural difference.

Figure 6:
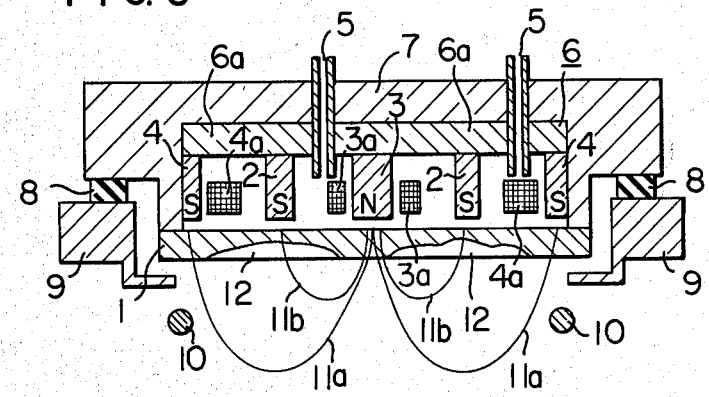

An excitation current is applied to the inner coil winding 3a so that a magnetic flux density parallel to the surface of the planar target plate is set to be for example 0.025 to 0.038 Wb/m². The other process of formation of plasma region is the same in the embodiments shown in FIGS. 2, 4 and 5. FIGS. 6 and 7 are cross-sectional views for explaining a flux control operation in the embodiment shown in FIG. 5, and each of the pole portions 2, 3 and 4 has such a magnetic polarity as shown in these figures to show the flux control operation. Since the flux control operation is substantially the same as that in the embodiment shown in FIGS. 2 and 4 and therefore is readily inferred, the explanation thereof is omitted.

Now, explanation will be made on actual sputtering cathode structures.

Figure 9A:
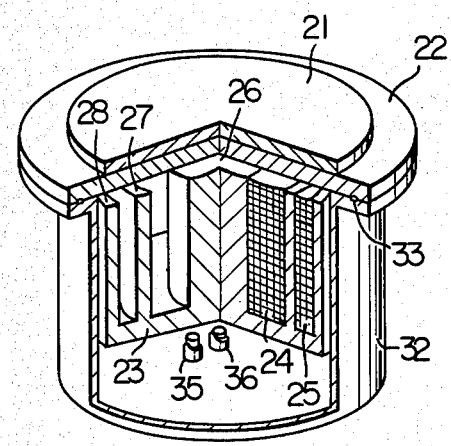
FIG. 9a is a partly cutaway view in perspective of a first actual embodiment of a target structure according to the present invention which is suitable for use in planar magnetron sputtering apparatuses.
Figure 9B:
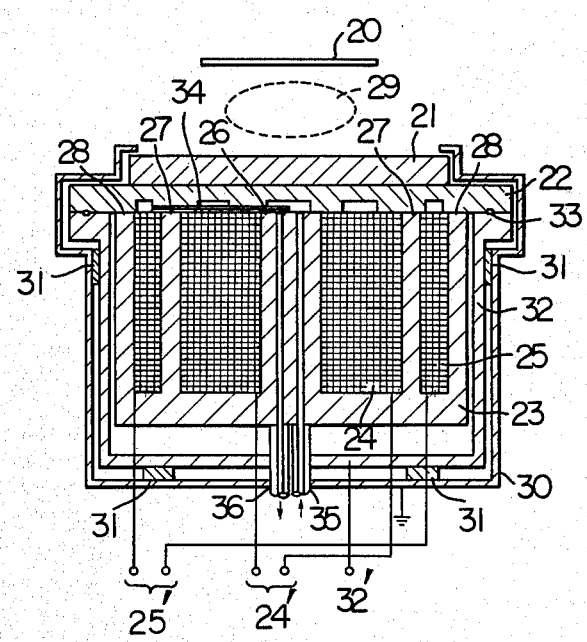

FIG. 9a is a partially cutaway view of an embodiment of a sputtering cathode structure according to the present invention, viewed from the side of an electrode portion, and FIG. 9b is a transverse sectional view of the embodiment shown in FIG. 9a. Incidentally, a shield 30 which is shown in FIG. 9b and serves as an anode, is omitted in FIG. 9a.

The electrode portion includes such main elements as a planar target plate 21 (which is made of an Al-2%Si alloy and has a diameter of 254 mm and a thickness of 20 mm), a backing plate 22 which is bonded to the planar target plate 21 with an appropriate solder, serves as a cathode, and is made of copper, an integrated magnetic flux generating yoke 23 for generating a predetermined flux distribution in a space above a first main surface of the planar target plate 21, an inner exciting coil 24, an outer exciting coil 25, a center pole tip 26, an inner pole tip 27, an outer pole tip 28, a shield 30 which is grounded serving as an anode, an insulating spacer 31, an electrode support 32, and an O-ring (a gasket) 33. The present embodiment includes the electrode support 32 and the O-ring 33 for the following reason. The integrated magnetic flux generating yoke 23 is provided in a space which is filled with air at atmospheric pressure, and to which a coolant is exposed. On the other hand, the planar target plate 21 is provided in another space which is evacuated to low vacuum. Therefore, it is necessary to isolate these spaces from each other with the O-ring 33 and the electrode support 32.

Further, a passage 34 for the coolant such as water is formed in the back surface of the backing plate 22. Inlet and outlet pipes 35 and 36, respectively, are provided to supply the coolant from the outside to the passage 34 through the integrating magnetic flux generating yoke 23 and to discharge the coolant. Thus, the planar target plate 21 can be cooled. Incidentally, reference numeral 20 designates a substrate on which a film is to be formed, and 29 a torus plasma formed in a sputtering process.

Figure 10:
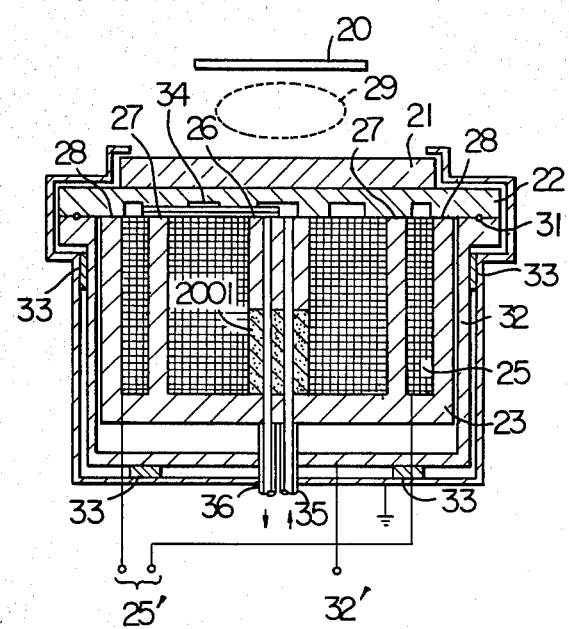
FIG. 10 is a transverse sectional view showing a second embodiment of a target structure according to the present invention in which a permanent magnet is used as a center pole portion.
Figure 18:
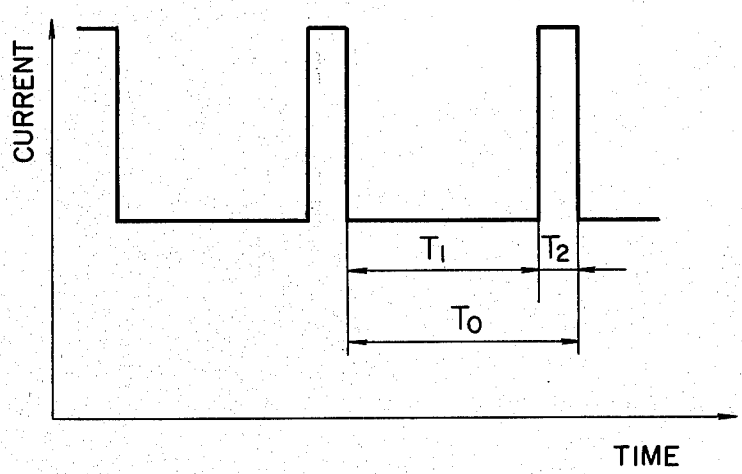
FIG. 18 shows the waveform of a current flowing through an outer electromagnet in the case where the magnetomotive force of an inner electromagnet is kept constant and the magnetomotive force of the outer electromagnet is varied periodically to obtain the thickness distribution shown in FIG. 17.

FIG. 10 shows another embodiment of a target structure. In this embodiment, part or the whole of the center pole portion is replaced by a permanent magnet 2001 generating magnetic flux of a fixed strength, and a current having such a waveform like that shown in FIG. 18 or 27 is forced to flow through the outer coil winding 25. Thus, the diameter of torus plasma can be controlled as in the embodiment shown in FIGS. 9a and 9b. The waveforms shown in FIGS. 18 and 27 will be described later in detail.

Figure 11:
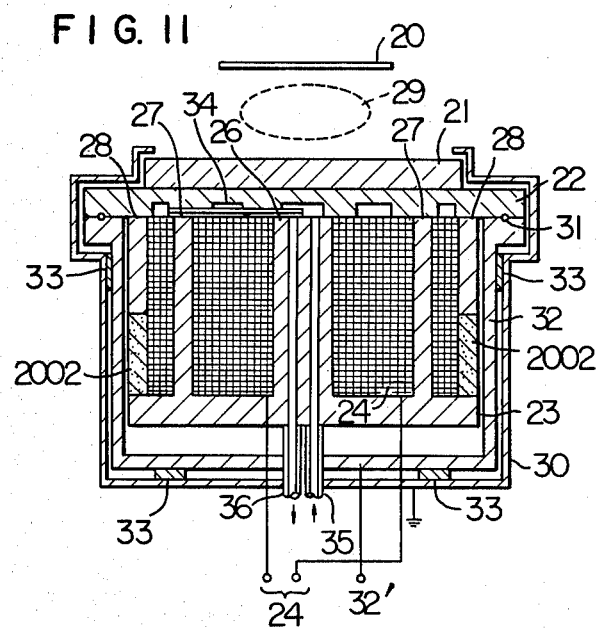
FIG. 11 is a transverse sectional view showing a third embodiment of a target structure according to the present invention in which a permanent magnet is used as an outer pole portion.

FIG. 11 shows a further embodiment of a target structure according to the present invention. In this embodiment, part or the whole of the outer pole portion is replaced by a permanent magnet 2002 generating magnetic flux of a fixed strength and a current having such a waveform as shown in FIG. 18 or 27 is forced to flow through the inner coil winding 24. Thus, the diameter of a torus plasma can be controlled as in the embodiment shown in FIGS. 9a and 9b but in the reversed polarity of the current. In more detail, in the embodiment shown in FIG. 11, the diameter of torus plasma ring is large or small according to whether the current flowing through the inner exciting coil 24 is large or small, respectively.

In FIGS. 10 and 11, part of the magnetic pole portions are formed of permanent magnets 2001 and 2002 of a hard magnetic material. It is preferable to form the surface or open end portions of such poles are made of soft magnetic material as indicated by 26 and 28 to enhance the ability of confining the magnetic flux in a desired area. Further, the length of the permanent magnet is preferably short to form a thorough flux path of low magnetic resistance. Particularly in FIG. 11, the outermost pole 28 serves as an enclosure member for limiting the maximum extension of the flux distribution above the integrated flux source structure and hence is preferably strongly coupled with the yoke 23 to provide a high controllability on the flux distribution. The yoke may be extended outside the outermost pole to further reduce the magnetic resistance.

In the embodiments shown in FIGS. 9a, 9b, 10 and 11, the planar target plate 21 has the form of a circular plate, since a film is deposited on a circular substrate. However, it is preferable to use a planar target plate having a rectangular form, when rectangular substrates are employed. That is, the circular electrode portion in these embodiments is an example, and an electrode portion having a rectangular form or any other form is also included in the scope of the present invention.

Figure 12:
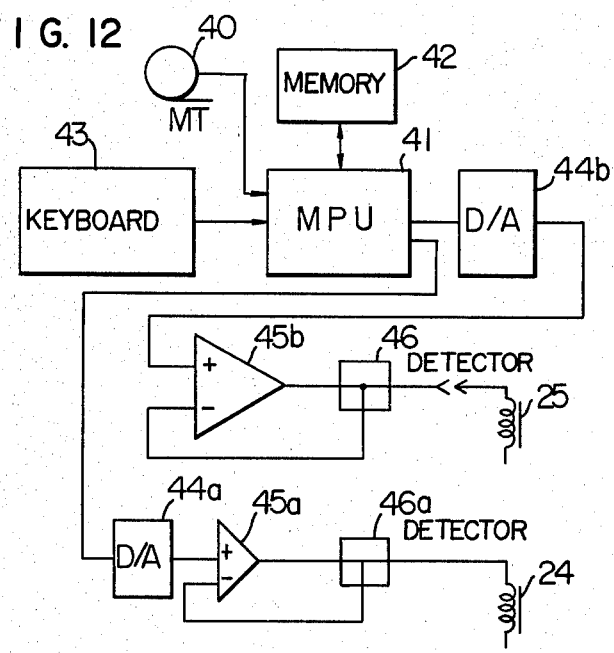
FIG. 12 is a block diagram showing a circuit arrangement of a driving device for driving electromagnets used in each of the embodiments shown in FIGS. 9a, 9b, 10 and 11.

FIG. 12 is a block diagram for showing a circuit arrangement of an electromagnet exciting power supply for a sputtering cathode structure according to an embodiment of the present invention. The electromagnet exciting power supply includes two programmable constant current sources to control the inner and outer exciting coil windings 24 and 25 independently. Referring to FIG. 12, a microprocessor unit (MPU) 41 and a memory 42 are used to freely control the current flowing through each of the exciting coil windings 24 and 25, that is, to supply to each exciting coil a programmed constant current, a programmed rectangular wave current having a predetermined fixed period, a programmed triangular wave current having a predetermined fixed period, an programmed alternating current, or the like. A keyboard 43 and an external memory device 40 such as a magnetic tape or a magnetic disc are used to give MPU 41 information on a predetermined current waveform, and the outputs of MPU 41 are applied to digital-to-analog converters 44a and 44b. The outputs of the converters 44a and 44b are amplified by current amplifiers to current values sufficient to excite the inner and outer exciting coils 24 and 25 at required levels.

The electromagnet exciting power supply shown in FIG. 12 can supply a programmed constant current to the exciting coil windings 24 and 25 to control these exciting coil windings. Further, the electromagnet exciting power supply includes output current detecting parts 46a and 46b each for detecting the current flowing through a corresponding one of the exciting coils. The detected currents from the detecting parts 46a and 46b are fed back to the current amplifiers 45a and 45b, to be compared with predetermined current values outputted from the converters 44a and 44b and to be corrected. Thus, each of the exciting coil windings 24 and 25 is applied with a dc current or a rectangular wave current.

A high voltage dc supply (not shown) for supplying discharge power required for sputtering, namely, a sputtering power supply generates voltages in a range from 0 to 800 V and supplies currents in a range from 0 to 15 A, similarly to a conventional magnetron sputtering power supply. Further, the high voltage supply is preferably a constant current source in nature to enhance the controllability of the electric power given to glow discharge, similarly to a conventional magnetron sputtering power supply.

Figure 13:
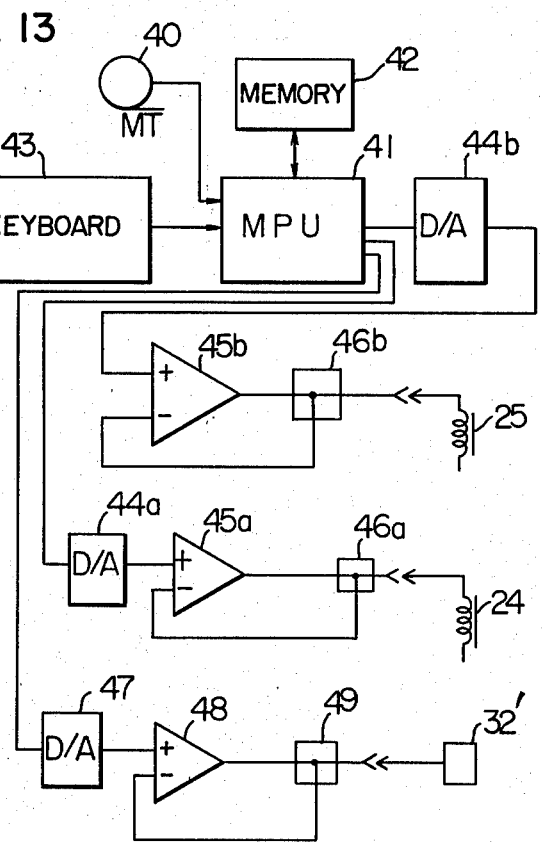
FIG. 13 is a block diagram showing a circuit arrangement of a driving device for driving electromagnets used in each of the embodiments shown in FIGS. 9a, 9b, 10 and 11 and a power source for sputtering.

The electromagnet exciting power supply shown in FIG. 12 is used in the case where the electromagnet exciting power supply and the high voltage source for supplying discharge power are provided independently from each other. However, it is possible to make a device in which the electromagnet exciting power supply and a high voltage power supply be associated with each other in carrying out sputtering. FIG. 13 is a block diagram of a control circuit system which is an embodiment of the abovementioned device. The circuit configuration shown in FIG. 13 includes a circuit for controlling the high voltage power supply for glow discharge, in addition to the circuit configuration shown in FIG. 12.

In FIG. 13, reference numeral 47 designates a digital-to-analog converter, 48 a power amplifier, and 49 an output power detecting part. The operation of the circuit for controlling the sputtering power will be briefly explained below. In the control circuit system shown in FIG. 13, the output from the output power detecting part 49 is fed back to the power amplifier 48 in order for a power which is supplied from the power amplifier to the electrode support 32, not to deviate from a value which is programmed and set by MPU 41.

Further, the shield 30 serving as an anode is grounded, and a sputtering voltage is given between the upper end of the shield 30 and the planar target plate 21. Accordingly, when the above-mentioned set value of the sputtering voltage given between the grounded shield 30 and planar target plate 21 is increased, the amount of argon ions which are generated by glow discharge to bombard the planar target plate 21, and current fed to the cathode are increased and therefore the amount of sputtered material is also increased with increasing the electrical power fed from the high voltage power supply for sputtering. Conversely, when the set value is decreased, the amount of sputtered material is decreased.

In the case where only the electromagnet exciting power supply shown in FIG. 12 is employed, a sputtering power supplied to the electrode support 32, which is electrically connected to the planar target plate 21 and backing plate 22, is kept constant independently of the position of torus plasma ring. On the other hand, in the case where the control circuit system shown in FIG. 13 is employed, it is possible to make the sputtering power correspond to variations in diameter of plasma ring so that a film having a uniform thickness is obtained.

Now, explanation will be made on a preferred method of controlling magnetic flux in a target structure according to the present invention.

Prior to the explanation of the above-mentioned method, the essence of the technical thought of the present invention will be explained more clearly.

First, a conventional knowledge of a few phenomena which has been obtained by theoretical and experimental studies, will be described.

An erosion region in the planar target plate 21 where sputtering takes place, is substantially aligned with and underlies a region where a torus plasma ring is generated. Further, in the case where a vacuum chamber for planar magnetron sputtering is filled with a discharge gas at a pressure of 1 to 10 mTorr, a plasma ring is generated in only an empty region which is spaced 10 to 20 mm apart from a first main surface of the planar target plate 21, and where a magnetic field vector is parallel to the first main surface of the planar target plate 21. Therefore, it is the effective means for finding the position of an erosion region in the planar target plate to know a magnetic field distribution in an empty space above the first main surface of the planar target plate.

However, the technical thought of the present invention is to move magnetic flux above an integrated magnetic flux source by the action of the Maxwell stress. Therefore, the magnetic flux distribution is important in the present invention.

Figure 14:
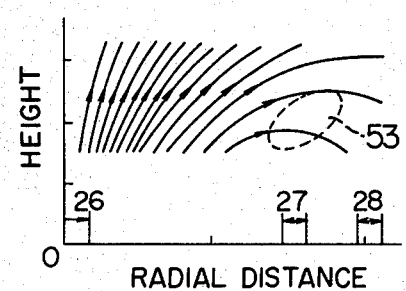
FIGS. 14 and 15 show examples of a flux distribution measured in a space above a sputtering cathode structure according to the present invention.
Figure 15:
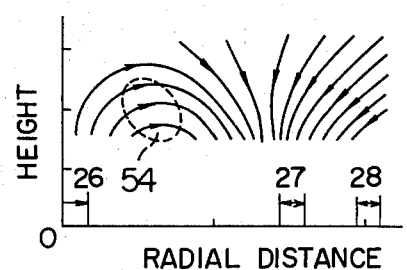

In order to simulate a flux distribution above the planar target plate 21 of the embodiment shown in FIGS. 9a and 9b, a test yoke having substantially the same size as the yoke of the embodiment shown in FIGS. 9a and 9b has been prepared. FIGS. 14 and 15 show examples of flux distribution measured on the test yoke. The flux distribution shown in each of FIGS. 14 and 15 is obtained in the case where a current flowing through the inner exciting coil winding 24 is opposite in polarity to a current flowing through the outer exciting coil winding 25.

Further, the flux distribution shown in FIG. 14 is obtained when the magnetomotive force of the inner exciting coil winding 24 and that of the outer exciting coil winding 25 are in the ratio of 40:1, and the flux distribution shown in FIG. 15 is obtained when the magnetomotive force of the inner exciting coil winding 24 and that of the outer exciting coil winding 25 are in the ratio of 1.5:1.

The test yoke used in this experiment is slightly different from that of the embodiment shown in FIGS. 9a and 9b in that grooves for mounting therein the inner and outer exciting coil windings 24 and 25 are shallow, but such a difference will produce small effect on the experimental results. In FIGS. 14 and 15, a distance (in mm) in the radial direction from the center axis of the sputtering cathode structure, namely, the center axis of the pole tip 26 is plotted as abscissa and the height (in mm) from the pole tips 26, 27 and 28 as ordinate.

The areas of the poles 26, 27 and 28 are schematically indicated by arrowed regions. Electromagnet windings exist between the poles. In the case of FIG. 14, the exciting current for the outer coil winding is almost negligible. Most of the lines of magnetic flux originate from an inner part of the space defined inside the pole 27 and sink into the pole 27 or the yoke 23 through the outside of the outermost pole 28. In the case of FIG. 15, the exciting current for the outer coil winding is increased in magnitude (in opposite direction to the inner coil current) to be comparable to the inner coil current. Thus, the area bridging an outer part of the inner groove between the poles 26 and 27 to an inner part of the outer groove between the poles 27 and 28 is converted to work as a flux sink. It will be apparently seen that, due to the integrated flux source structure including a plurality of magnet means magnetically coupled with a magnetic yoke, the area where the lines of magnetic flux generate, is significantly reduced to a narrow region around the center axis and the area on the target where the magnetic flux lines sink is enlarged inwardly to a great extent (beyond the intermediate pole portion 27). In this way, the overall distribution of the flux lines can be greatly varied by varying the polarity and the magnitude of the respective exciting currents for the inner and outer coil windings. In accompany with the change of distribution, the sputtering or erosion region above which the flux lines are substantially parallel to the target surface (regions indicated by dotted lines 53, 54), can be largely shifted. The erosion region can be shifted from the neighborhood of the center pole 26 to that of the outermost pole 28.

It may be noted that the integrated flux source including the pole portions and the yoke serves as a kind of distributed flux source. The outermost pole portion serves as an enclosure for physically enclosing the integrated source structure and magnetically limiting the maximum extension of the flux distribution. Thus, at least a part of the outermost pole and the yoke coupling all the poles are preferably formed of a soft magnetic material of high permeability to enhance the flux controlling ability. Considering the permeability of vacuum or air (about one), the permeability of the yoke and the outermost pole is preferably larger than about 100. The outermost pole of a high permeability coupled with the yoke effectively works to confine the flux lines in a limited space. It may be noted that in case of FIG. 11, the outermost magnetic pole of soft magnetic material is coupled to the magnetic yoke only through a permanent magnet but will exhibit a similar confinement effect (although the effect is reduced to some extent). It should be understood that the outermost pole should not be separated away from the outside periphery of the yoke through a significant gap. For example, if a separate outer magnet means is placed outside the yoke with a significant vacuum gap therebetween, the gap of $\mu s = 1$ between the separate magnet means and the yokr prevents strong magnetic coupling therebetween. It is important that the magnet means are disposed at least partially within the projection (normal to the target plane) of the yoke. It will be apparent that other embodiments attain similar effects as described above.

According to the above-mentioned knowledge, a torus plasma is generated in a region where a magnetic field vector is parallel to the first main surface of the planar target plate 21, and therefore is generated in regions 53 and 54 in FIGS. 14 and 15.

However, when the measured results are viewed on the basis of the technical thought of the present invention, the flux distribution shown in FIG. 14 is changed to the flux distribution shown in FIG. 15 by varying the magnetomotive forces of the inner and outer exciting coil windings 24 and 25. That is, the region where a plasma ring is generated, is moved.

In more detail, the flux distributions shown in FIGS. 14 and 15 are obtained when the magnetomotive force of the inner exciting coil winding 24 is kept constant and the magnetomotive force of the outer exciting coil 25 is changed from 1/40 to 1/1.5 of the magnetomotive force of the inner exciting coil 24. It is to be noted that the flux distribution shown in FIG. 14 is opposite, in direction of magnetic flux with respect to the magnetic flux source, to the flux distribution shown in FIG. 15. Further, when the magnetomotive force of the outer exciting coil 25 is kept constant and the magnetomotive force of the inner exciting ocil 24 is changed, flux distributions similar to those shown in FIGS. 14 and 15 are formed above and planar target plate. Accordingly, a torus plasma can be moved.

Next, explanation will be made on an embodiment of a method of controlling magnetic flux according to the present invention which is based upon the above-mentioned experimental results.

A method of controlling magnetic flux according to the present invention will be studied, as described later with reference to experimental results, from two viewpoints, that is, a first viewpoint as to whether a uniform distribution of film thickness can be obtained at a film or not, and a second viewpoint as to whether the life of planar target plate can be increased or not.

A first fundamental technical thought of the present invention that a favorable thickness distribution of a film is formed by synthesis, means that each of the currents flowing through the inner and outer exciting coil windings is controlled so that a ratio of a time during which the diameter of plasma ring is small, to a time during which the diameter of plasma ring is large, is made smaller than 1 (one) when a constant sputtering power is supplied. In other words, conditions necessary to make a large number of deposition of films with each having a uniform thickness distribution while using a large portion of the planar target plate, that is, increasing the life thereof, do exist in a method for exciting the electromagnetic exciting coils so that the above-mentioned ratio is made smaller than 1 (one).

The most fundamental embodiment will be explained below.

Figure 16:
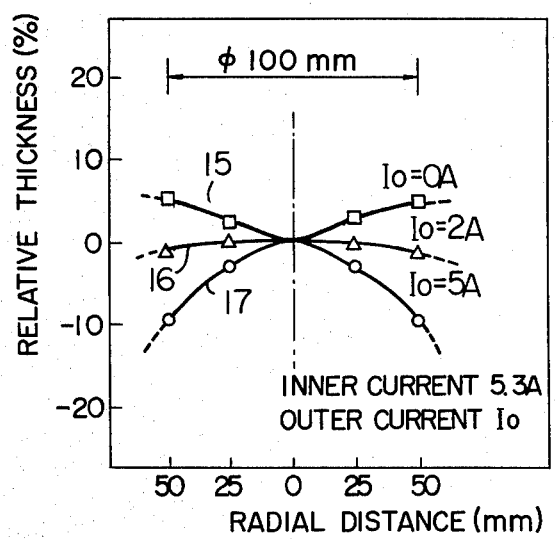
FIG. 16 shows relations between the distance from the center of a wafer and the thickness of a film deposited on the wafer, measured for various values of the currents flowing through outer and inner electromagnets when the embodiment shown in FIG. 5 is employed.

FIG. 16 discloses an excellent technique which is made possible by the present embodiment, and shows that not only a uniform thickness distribution of a film but also a given film thickness distribution can be obtained, that is, that a thickness distribution of a film on a substrate can be controlled. FIG. 16 shows only a part of experimental results, that is, relations between a distance from the center of a wafer in a radial direction and a change in thicknness of a film formed on the wafer, in the case where a control current flowing through the second exciting coil winding 24' in the embodiment shown in FIG. 9b (referred to as "inner current" in FIG. 16) is kept constant and another control current flowing through the first exciting coil winding 25' in FIG. 9b (referred to as "outer current" in FIG. 16) is varied. In FIG. 16, a curve 15 (with marks □) indicates a thickness distribution which is convex downward, a curve 16 (with marks Δ) a thickness distribution which is approximately uniform, and a curve 16 (with marks O) a thickness distribution which is convex upward. Further, similar thickness distributions can be obtained by appropriately combining two control current values.

Further, when the planar target plate 1 made of a magnetic material is used in the conventional planar magnetron sputtering cathode structure, the lines of magnetic flux 11a and 11b in FIG. 4 are absorbed by the planar target plate 1, and therefore it is difficult to form a magnetic field distribution capable of holding a torus plasma region.

The reason is that a planar target plate made of soft magnetic material forms a closed magnetic circuit together with the yoke, and hence, the planar target plate absorbs major amount of the magnetic flux which has been expected to form a preferable magnetic flux distribution for sputtering, and that the flux density is much reduced in front of the planar target plate.

In order to realize planar magnetron sputtering with respect to a magnetic material with a high magnetic permeability, the magnetic flux generating means should be stronger so that the magnetic material of the planar target plate is driven to the magnetic saturation by the magnetic flux generating means so as to form a sufficiently strong leakage magnetic flux density for the planar magnetron sputtering in front of the planar target plate of soft magnetic material.

However, the erosion region on the planar target plate of soft magnetic material used in conventional planar magnetron sputtering spparatuses is strictly confined in a narrow ring region. Once the erosion region is formed, and the thickness of the planar target plate, where the erosion region is formed, is reduced, then, the leakage magnetic flux which confines the torus plasma is enhanced. This enhancement in the magnetic flux density strengthens proceeding of the erosion, and thus, again the magnetic leakage flux is enhanced.

This cyclic process makes the erosion profile, that is, the V-shaped vally profile becomes steeper than the case where a non-magnetic material is used for the planar target plate. Therefore in the case of a conventional planar magnetron sputtering apparatus, the life of the target plate made of a soft magnetic material is much shorter than a case where non-magnetic planar target plate is used because of the lower utilization efficiency of the target material.

Difficulty of the planar magnetron sputtering of a soft magnetic material described above can be eliminated by the embodiment shown in FIGS. 3, 4, 6, 9b according to the present invention. As mentioned earlier, the erosion area on the planar target material can be widened by appropriately controlling the diameter of the torus plasma, the formation speed of the steep erosion on the planar target plate of a soft magnetic material in the case of a conventional planar magnetron sputtering spparatus can be reduced by widening the area on the planar target where the erosion occurs.

Therefore, the utilization efficiency of the target material (which is soft magnetic, in this case) can be raised, and hence, the life of the target material can be elongated.

In the foregoing description, a special case where only the first, second and third pole portions are included in a target structure, has been explained. As is evident from the above-mentioned explanation, the technical thought of the present invention includes all magnetic field control techniques in which three or more pole portions are included in a sputtering cathode structure and each of these pole portions is formed of a permanent magnet or magnetic flux control means made up of a soft magnetic material (namely, a high permeability magnetic material) such as soft iron ($\mu s$ = about 500 to about 1000) and the magnetic flux path means (namely, a yoke made of a soft magnetic material, such as soft ion) and an exciting coil so as to form a given combination of permanent magnet and magnetic flux control means. Further, it is also evident that a magnetic flux control current flowing through the exciting coil winding (that is, an electromagnet) may have a waveform corresponding to one of periodic functions, for example Fourier series functions may be used.

Another example of a magnetic flux control current in forming a film on a substrate will be explained below in detail.

Figure 17:
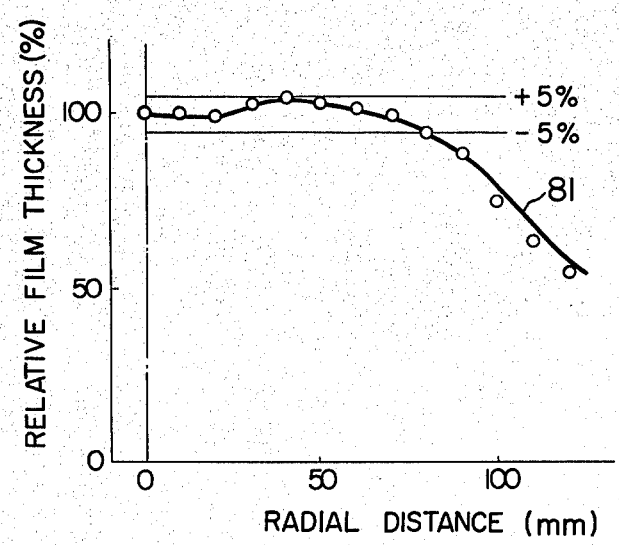
FIG. 17 shows a measured thickness distribution of a film composed of different type of sub-layers and also shows that the measured distribution can be estimated from thickness distributions of the respective sublayers which constitute the composite film.

A curve 81 in FIG. 17 shows a thickness distribution of a film obtained in the case where a flux density of about 0.025 Wb/m$^2$ was generated above the planar target plate only by the inner exciting coil winding 24 with the magnetomotive force of the outer exciting coil 25 being equal to zero. In more detail, a constant amount of dc current was supplied to the inner exciting coil winding 24 through the digital-to-analog converter 44a and current amplifier 45a on the basis of a command from MPU 41 so that the inner exciting coil 24 generated a magnetomotive force of 10,000 ampere-turns, and such a square wave current having a period $T_0$ as shown in FIG. 18 was supplied to the outer exciting coil winding 25 from the digital-to-analog converter 44b and current amplifier 45b on the basis of a command from MPU 41. That is, the magnetomotive force of the outer exciting coil winding 25 has the form of a square wave pulse having the period $T_0$. A time $T_1$ during which a plasma ring has the largest diameter with magnetomotive force of 10,000 ampere-turns was made equal to 10 sec., and a time $T_2$ during which the plasma ring has the smallest diameter with a magnetomotive force of 2,000 ampere-turns was made equal to 2 sec. Such a square wave current having a period of $T_0$ of 12 sec. was supplied to the outer exciting coil winding 25 for 120 sec. In other words, the inner and outer exciting coil windings 24 and 25 were excited for 10 times by 12 sec. period current waveform to perform sputtering. It is evident that the electromagnet forces included in this current wave form in exciting coil winding of 10,000 and 2,000 ampere-turns are the examples of current controlling conditions. Additionally speaking, a substrate on which a film is deposited, was spaced 77 mm apart from the first main surface of the planar target plate 21, and the vacuum chamber for sputtering was filled with argon gas, whose purity is 99.999%, at a pressure of 5.4 mTorr.

Figure 20:
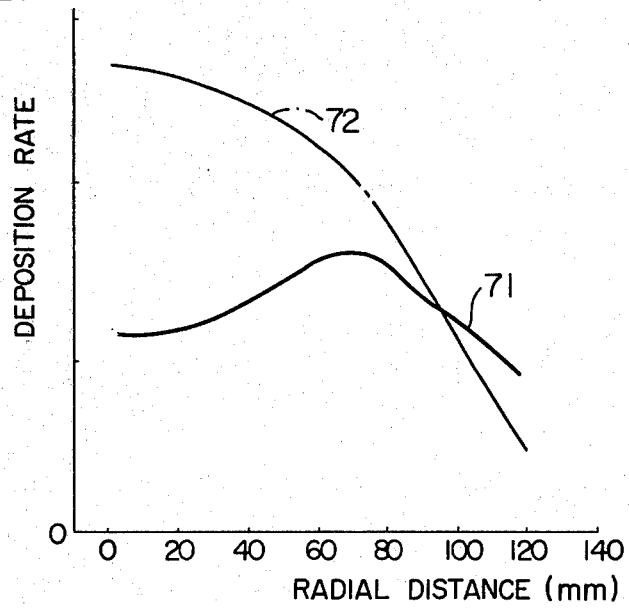
FIG. 20 shows two typical thickness distributions of a film which are obtained with the use of an embodiment of the present invention.

FIG. 17 shows a thickness distribution of synthesized film which is obtained in such a manner that a thickness distribution characteristic indicated by a curve 71 in FIG. 20 and a thickness distribution characteristic indicated by a curve 72 in FIG. 20 are combined with each other. The above-mentioned synthesized film has been actually formed on the basis of data which are obtained by calculation of a synthesized film based upon the previously obtained curves 71 and 72 shown in FIG. 20 so that the composite film has the largest area provided that uniformity in thickness is within an allowable range of ±5%, and that the time during which a plasma ring has the smallest diameter is made as long as possible in order to raise the utilization efficiency of the planar target plate material. In FIG. 17, each of points indicated by marks O shows a thickness according to the calculation mentioned above and the curve 81 (solid line) shows a thickness distribution of an actually synthesized film which shows a good agreement between them.

In the above description, explanation has been made on a few experimental facts forming the basis of the technical thought of the present invention. Now, a more concrete embodiment will be explained below, together with a process of extracting this technical thought.

Figure 19:
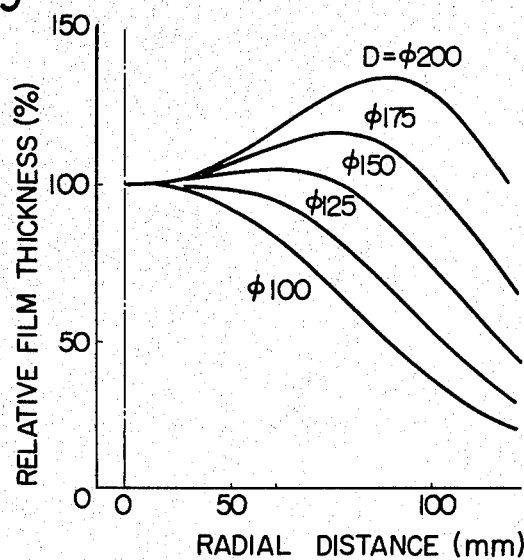
FIG. 19 shows examples of the thickness distribution of a film which are obtained by calculation.

FIG. 19 shows a relation obtained by calculation between a diameter D of an annular erosion region formed in the planar target plate and a thickness distribution of a film deposited on the substrate 20 which was placed parallel to and spaced 85 mm apart from the first main surface of the planar target plate. This relation can be used to explain the first fundamental technical thought of the present invention. In FIG. 19, a film thickness in percent (in the case where a film thickness at the center of the substrate is expressed by 100%) is plotted as ordinate, and a distance (in mm) from the center of the substrate in a radial direction as abscissa.

As is apparent from FIG. 19, when the diameter D of annular erosion region is large, say, D=200 mm or D=175 mm in FIG. 19, a thickness distribution is obtained which has a peak at a position spaced about 100 mm apart from the center of the substrate in a radial direction. That is, the thickness distribution having two peaks like as shoulders is obtained. Conversely, when the diameter D is small, that is not greater than 125 mm in FIG. 19, a thickness distribution is obtained which has a peak at the center of the substrate.

In the above description, explanation has been made on how the thickness distribution of a film depends upon the diameter D of annular erosion region. As mentioned previously, an annular erosion region is generated substantially just under a plasma ring, and therefore the diameter of the annular erosion region can be regarded as a measure of the diameter of the plasma ring. Accordingly, it is expected that various kinds of thickness distributions such as shown in FIG. 19 can be obtained by changing the diameter of plasma ring in a manner as shown in FIGS. 14 and 15.

FIG. 20 shows two actual examples of thickness distribution characteristics obtained in the above-mentioned embodiment. In FIG. 20, a curve 71 shows a thickness distribution characteristics which is obtained when a magnetomotive force of the outer exciting coil 25 is made equal to zero and a magnetic field strength of about 200 gauss is generated above the planar target plate by the inner exciting coil 24, and a curve 72 shows a thickness distribution characteristic obtained when a magnetomotive force of the inner exciting coil winding 24 and a magnetomotive force of the outer exciting coil 25 are in the ratio of 5:1. The curves 71 and 72 in FIG. 20 were obtained when a substrate on which a film is formed, was spaced 80 mm apart from the first main surface of the planar target plate 21 and a vacuum vessel for sputtering was filled with argon gas, whose purity was 99.999%, at a pressure of 5.4 mTorr.

In FIG. 20, a deposition rate of film on a substrate is plotted as ordinate, and a distance (in mm) on the substrate taken in a radial direction from the center axis of the electrode portion of the target structure is plotted as abscissa.

Figure 21:
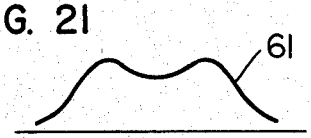
FIG. 21 is a diagrammatic view for explaining the assembly (or synthesis) of a plurality of films of different thickness distribution to form a uniform composite film.

As is apparent from FIG. 20, when the magnetomotive force of the outer exciting coil 25 is increased and thereby the difference in magnetomotive force between the inner and outer exciting coils is decreased, the diameter of plasma ring is decreased and thus such a film thickness distribution characteristic as indicated by a curve 62 in FIG. 21 is obtained. On the other hand, when the magnetomotive force of the outer exciting coil winding 25 is decreased, the diameter of plasma ring is increased, and thus such a film thickness distribution characteristic as indicated by a curve 61 in FIG. 21 is obtained.

When the magnetomotive force of the outer exciting coil winding 25 was varied to obtain the film thickness distribution characteristics indicated by the curves 71 and 72 in FIG. 20, the plasma ring was moved but a discharge impedance of glow discharge, namely, a ratio of a voltage applied to the planar target plate to a current flowing into the planar target plate varied only by ±5% or less. As mentioned previously, a sputtering power source having a constant current characteristics was employed in the present embodiment. Accordingly, a sputtering power supplied to the planar target plate was substantially constant.

In the case where a constant sputtering power is supplied as in the present embodiment, when the diameter of plasma ring is made small, the area of plasma ring, that is, the area of an erosion region generated by sputtering in the first main surface of the planar target plate becomes small, and therefore an electric power per unit area on the first main surface of the planar target plate 21 is increased. As is well known, in planar magnetron sputtering, a deposition rate of film on a substrate is approximately proportional to a power supplied to unit area of an erosion region on the planar target plate. Accordingly, the deposition rate of film at a central region of the substrate which is obtained when the diameter of plasma ring is controlled to be small, is larger than the deposition rate of film at the same region which is obtained when the diameter of plasma ring is controlled to be large, as shown in FIG. 20.

FIG. 21 is a diagrammatic view for showing an aspect of the technical thought of the present invention that a uniform thickness distribution in a film can be obtained by synthesizing a plurality of film thickness distribution characteristics. In FIG. 21, a curve 61 shows an example of a film thickness distribution characteristics which will be obtained when a current flowing through the inner exciting coil winding 24 and a current flowing through the outer exciting coil 25 are made of opposite direction to each other to induce virtual magnetic poles of opposite polarity above the target surface and the magnitude of the magnetomotive force of the outer exciting coil 25 and that of the inner exciting coil winding 24 are selected at a ratio of, for example, 1:40 to generate a magnetic flux distribution shown in FIG. 14. Further, a curve 62 shows an example of a film thickness distribution characteristics which will be obtained when the magnitude of the magnetomotive force of the inner exciting coil 24 and that of the outer exciting coil 25 are selected at a ratio of, for example, 1.5:1. In short, curves 61 and 62 correspond to the cases of FIGS. 14 and 15, respectively.

When an operation for generating the thickness distribution characteristics 61 and an operation for generating the thickness distribution characteristics 62 are appropriately performed on a same substrate by varying the magnetomotive forces of the inner (and/or) outer exciting coil windings, a resultant thickness distribution characteristics such as indicated by a curve 63 is obtained on the substrate as the sum of the characteristics 61 and 62. Thus, a film having a uniform thickness can be formed in a large area on the substrate.

In order to make a film thickness distribution in a large area on a substrate as uniform as possible by combining a thickness distribution characteristics having a single peak and a thickness distribution characteristic having a ring-shaped peak (hereinafter, referred to as double peak or double hump), it is required to appropriately select the ratio of a time during which the diameter of plasma ring is small to a time during which the diameter of plasma ring is large in a process for forming a film on the substrate. As mentioned previously, the deposition rate of film at a central portion of the substrate which is obtained when the diameter of torus plasma is small, is larger than the deposition rate of film at the same portion which is obtained when the diameter of torus plasma is large, provided that the sputtering power is maintained constant. Thus, the ratio of a time during which the diameter of plasma ring is small to a time during which the diameter of plasma ring is large, is required to be smaller than one for the case of constant sputtering power and of the controlled two diameters of large/small plasma rings in order to obtain an optimum film thickness distribution characteristic on the substrate.

Next, explanation will be made on the second viewpoint that elongating the life of planar target plate is considered. When the plasma ring is controlled to be large and small, the corresponding erosion region is also moved. It is generally considered that the degree of erosion in an erosion region, that is, a depth to which a planar target plate is eroded in unit time, is proportional to an electric power supplied to the unit area of the planar target plate. It is desirable to control the degree of erosion in a region of the planar target plate which corresponds to the small plasma ring, to be equal to to the degree of erosion in a region of the planar target plate which corresponds to the large plasma ring. When the degree of erosion in the former region does not balance with that in the latter region, the depth of erosion in one of these regions becomes equal to the thickness of the planar target plate earlier than the depth of erosion in the other region, and therefore the life of the planar target plate is short as compared with the case where erosion proceeds equally in these regions.

In a conventional sputtering cathode structure for the planar magnetron sputtering apparatus which generates a fixed magnetic field, an erosion region will have the form of a V-shaped valley when viewed in cross section of the planar target plate, as erosion proceeds locally in the planar target plate. As has been briefly described, the thickness distribution in a deposited film is changed and deteriorated as the V-shaped valley becomes deep. This fact will be explained below in more detail by means of models.

When a planar target plate has been used for sputtering only for a short time, a target material is sputtered away from the target plate surface in accordance with the cosine law, namely, a distribution as indicated by a curve 101 in FIG. 22b. Thus, the target material is sputtered over a wide range given by a relatively large solid angle.

On the other hand, when the previously-mentioned V-shaped valley has been formed like as shown in FIG. 23b in the planar target plate (21 in FIG. 23b), the target material is sputtered in accordance with a distribution curve 111 as shown in FIG. 23b and having a smaller solid angle as compared with the distribution curve 101 in FIG. 22b. A curve 102 in FIG. 22a indicates a thickness distribution of a film on a substrate corresponding to the curve 101, and a curve 112 in FIG. 23a indicates a thickness distribution corresponding to the curve 111. As is apparent from FIGS. 22a, 22b, 23a and 23b, the thickness distribution in a film is deteriorated when the V-shaped valley has been grown deep in the planar target plate 21.

The most remarkable effect will be explained below by experimental data shown in FIGS. 24 and 25.

Figure 24:
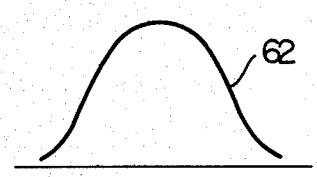
FIG. 24 shows how the thickness distribution of a film depends upon the time during which a target has been used, in the case where respective magnetomotive forces of the inner and outer electromagnets shown in FIGS. 9a and 9b are kept constant.
Figure 24:
Figure 24:
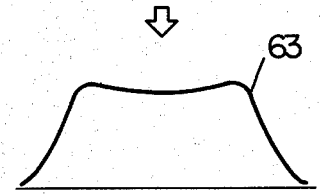
Figure 24:
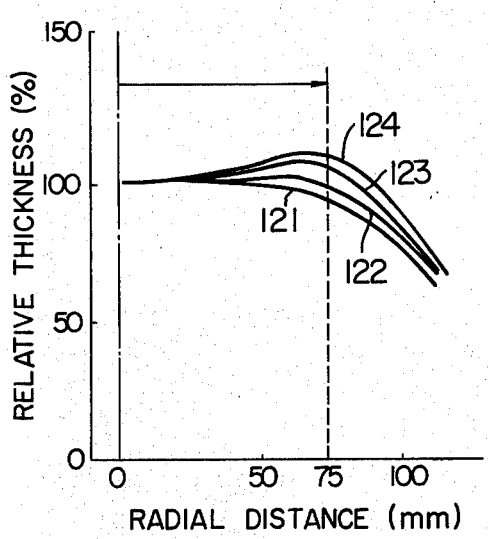

FIG. 24 shows the change in the relative thickness distribution in a film obtained when magnetomotive forces of the inner and outer exciting coils of the embodiment shown in FIGS. 9a and 9b are set to be constant during a deposition, that is, the same magnetic condition as the conventional magnetron sputtering cathode structure as to the fact that the magnetic flux distribution is fixed. The distribution depended upon the time during which the planar target plate has been used for sputtering. In FIG. 24, a curve 121 indicates a thickness distribution of a film obtained by the planar target plate which has been used for 2 min. in a sputtering process consuming a sputtering power of 6 KW, a curve 122 a thickness distribution of a film obtained by the planar target plate used for 10 hours in the above-mentioned process, a curve 123 a thickness distribution of a film obtained by the planar target plate used for 20 hours, and a curve 124 a thickness distribution of a film obtained by the planar target plate used for 30 hours. The depth of erosion in the planar target plate, i.e. the depth of V-shaped valley, was equal to zero, 2, 4 and 6 mm for the cases of the curves 121, 122, 123 and 124, respectively.

As is apparent from FIG. 24, when the depth of V-shaped valley becomes equal to 6 mm, variations in thickness of a film formed on a wafer having a diameter of 150 mm exceeded a practical allowable range of ±5%. (In more detail, the curve 123 shows more than 10% variation in thickness.)

Figure 25:
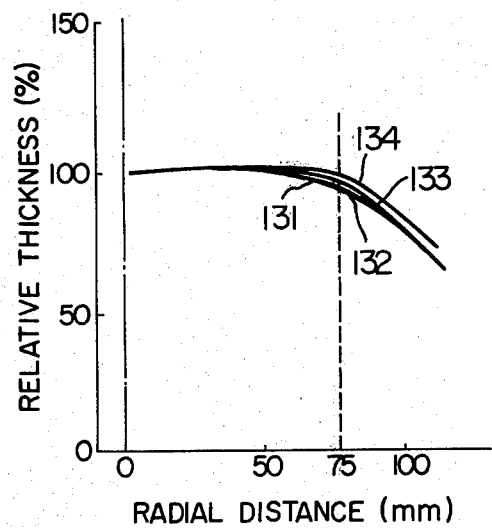
FIG. 25 shows how the thickness distribution of a film depends upon the time during which a target has been used, in the case where, in accordance with the present invention, the magnetomotive force of the inner electromagnet is kept constant and the periodically varying current shown in FIG. 18 is supplied to the outer electromagnet coil.

FIG. 25 is a graph for showing a second fundamental thought of the present invention and the most remarkable effect thereof.

FIG. 25 shows how the thickness distribution shown in FIG. 17, that is, the thickness distribution of a film obtained when a time during which the diameter of plasma ring is small, and a time during which the diameter of plasma ring is large, are in the ratio of 1:5, depends upon the time during which the planar target plate has been used for sputtering. Similarly to the case shown in FIG. 24, sputtering has been carried out at a fixed sputtering power of 6 KW. In FIG. 25, a curve 131 indicates a thickness distribution of a film obtained when the planar target plate has not yet been used, a curve 132 a thickness distribution at a film obtained after the use of the planar target plate for 20 hours in the sputtering process, a curve 133 a thickness distribution of a film obtained after the use of the planar target plate for 40 hours, and a curve 134 a thickness distribution at a film obtained after the use of the planar target plate for 60 hours.

It can be made clear by comparison between FIGS. 24 and 25 that when the diameter of plasma ring is periodically changed so that film thickness distributions with the single peak and double peak are synthesized and, concurrently, so as to enlarge an erosion region in the planar target plate, not only the V-shaped valley is formed slowly but also the apex angle of the V-shaped valley is kept to be large, and thus the thickness distribution of a film in the practical point of view, hardly depends upon the time during which the planar target plate has been used for sputtering.

Figure 26:
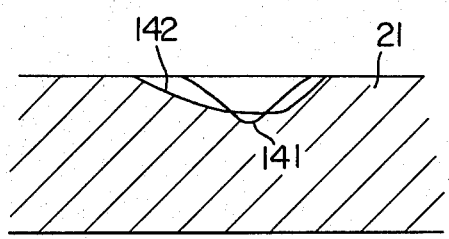
FIG. 26 is a diagrammatic view for showing how erosion proceeds in a planar target plate in an embodiment of the present invention.

The above-mentioned fact can be, further, confirmed by the fact shown in FIG. 26. FIG. 26 shows an observed cross sectional profile of an erosion region which is formed in the planar target plate 21 when the target plate has been used for 30 hours in a sputtering process. In FIG. 26, curve 141 shows an erosion region formed when sputtering is carried out in a manner corresponding to the thickness distributions shown in FIG. 24, that is, when the diameter of plasma ring is kept constant, and a curve 142 shows an erosion region formed when sputtering is carried out in a manner corresponding to the thickness distributions shown in FIG. 25, that is, when the diameter of plasma ring is periodically varied. It can be confirmed that the curve 141 is smaller in apex angle than that of the curve 142 and the thickness distribution 124 corresponding to the curve 141 has double peak characteristics.

In the foregoing description, explanation has been made on the case where films are formed on a substrate having a diameter of the order of 150 mm by means of that embodiment of a target structure according to the present invention which is shown in FIGS. 9a and 9b. However, the present invention is also applicable to a substrate having a larger area. As can be seen from the curve 142 in FIG. 26, when a substrate having a diameter of 150 mm or so is employed, a film having a satisfactory thickness distribution is obtained with an erosion region having a relatively small width. However, in the case where films are formed on a substrate having a larger area, it is required to make the planar target plate larger in accordance with the substrate.

In this case, if the plasma ring is generated only at two positions, as in the above-mentioned embodiments, a continuous erosion region such as indicated by the curve 142 in FIG. 26 will not be formed, two discrete relatively narrower annular erosion regions having such a cross section as indicated by the curve 141 in FIG. 26 is formed in the planar target plate 21 spacing apart from each other provided that the plasma ring diameter is controlled to be small and large. Accordingly, only a small portion of the planar target plate 21 will be utilized in this case. In this case, the available portion of the plate 21 can be increased for forming one or more annular erosion regions in addition to the above-mentioned two annular erosion regions. FIG. 27 shows an example of the waveform of a current supplied to the outer exciting coil winding 25. This current is obtained by converting a digital command signal from MPU 41 into an analog signal by the digital-to-analog converter 44b, and by amplifying the analog signal by the current amplifier 45b. Referring to FIG. 27; a plasma ring has a large diameter during a time $T_1'$, has an intermediate diameter during a time $T_2''$, has a small diameter during a time $T_3'$, has again the intermediate diameter during a time $T_2'''$, and then returns to the initial state in which the plasma ring has the large diameter. Accordingly, the total time $T_2'$, during which the plasma ring has the intermediate diameter, is given by an equation $T_2' = T_2'' + T_2'''$. In the case where a sputtering power is kept constant, as mentioned previously, a relation $T_1' > T_2' > T_3'$ is indispensable to make the depth of erosion in the planar target plate 21 approximately the same in erosion regions corresponding to the three diameters of the plasma ring, and to make erosion proceed uniformly at the widest possible portion of the planar target plate.

In the case where the diameter of plasma ring is controlled by the current shown in either one of FIGS. 18 and 27, when a sputtering power is kept constant, it is required to make a time during which the diameter of plasma ring is larger, longer than a time during which the diameter of plasma is small. Thus, erosion can proceed uniformly at the widest possible portion of the planar target plate, and a film having a uniform thickness is formed on a substrate. This is the fundamental technical thought of the present invention.

In the embodiment shown in FIGS. 9a and 9b, the relative magnetomotive force of the inner and outer exciting coils is varied to control the diameter of plasma ring. It is advantageous to vary the diameter of plasma ring by controlling only either one of a current flowing through the inner exciting coil winding or a current flowing through the outer exciting coil winding, since the circuit arrangement of an exciting source can be simplified. Accordingly, explanation has been made on the case where the outer exciting coil is supplied with the currents shown in FIGS. 18 and 27 to vary the diameter of plasma ring, by way of example.

A film forming method in the case where a sputtering power supplied to the electrode support 30 which is electrically connected to the planar target plate 21 and backing plate 20, is kept constant independently of the position of plasma ring, has been explained as an embodiment of a method of forming a film according to the present invention. However, it is also possible to form a film having a uniform thickness in such a manner that the sputtering power is controlled in accordance with the diameter of plasma ring.

Now, the case where the sputtering power is controlled, will be explained below in detail.

When the sputtering power is kept constant, a ratio of a time during which a plasma ring has a small diameter, to a time during which the plasma ring has a large diameter, is required to be made smaller than 1 (one), to obtain a film having a uniform erosion depth over the widest possible area of a planar target plate and concurrently a uniform film thickness distribution. Accordingly, a current having such a waveform as shown in FIG. 18 is supplied to the outer exciting current.

Let us consider for an example, the case where the outer exciting coil winding is supplied with a current having, for example, a waveform 181 shown in FIG. 28a, in place of the current having the waveform shown in FIG. 18. That is, a time during which the exciting current takes a high level, is made almost equal to a time during which the exciting current takes a low level.

Further, referring to FIG. 13, a command synchronized with a signal supplied to the digital-to-analog converter 44b is supplied from MPU 41 to the digital-to-analog converter 47, to be converted into an analog signal, which is amplified by the power amplifier 48 to be supplied to the electrode support 32. Thus, the electric power supplied to the electrode support 32 for sputtering has such a square waveform as designated by reference numeral 182 in FIG. 28b, and is controlled in synchronism with the current waveform 181 shown in FIG. 28a. When the current flowing through the outer exciting coil winding 25 is at the low level, the diameter of plasma ring is large. At this time, the sputtering power density at an annular erosion region is low as compared with a sputtering power density at a time during which the diameter of plasma is small, if the sputtering power is kept constant. Accordingly, when the diameter of plasma ring is large, a signal supplied from MPU 41 to the power amplifier 48 is made high in level to increase a sputtering power density supplied to the electrode support 32. On the other hand, when the diameter of the plasma ring is controlled to be small, the signal supplied from MPU 41 to the power amplifier 48 is made low in level to decrease the sputtering power density supplied to the electrode support 32. Thus, a film having a uniform thickness can be formed.

The synthesized film having the thickness distribution 81 shown in FIG. 17 can also be obtained by controlling a sputtering power supplied to the electrode support 30, in accordance with the diameter of plasma ring as mentioned above.

FIGS. 29a and 29b show an example which is obtained by expanding the above-mentioned thought. Referring to FIGS. 29a and 29b, a current 191 supplied from the current amplifier 45b to the outer exciting coil winding 25 is varied sinusoidally with time on the basis of a command from MPU 41, and a sputtering power 191 supplied from the power amplifier 48 to the electrode support 32 is almost sinusoidally controlled in synchronism with the current 191 on the basis of a command from MPU 41. Thus, it is possible to produce the same effect as in the case where the sputtering power is kept constant and the outer exciting coil winding is supplied with the controlling current shown in FIG. 18.

Further, the above-mentioned technical thought is also applicable to the case where the diameter of plasma ring is controlled stepwise twice or more as shown as an example in FIG. 30a. This case will be explained below with reference to FIGS. 30a and 30b.

FIG. 30a shows a waveform 201 of a current flowing through the outer exciting coil winding 25, and a relation $T_1' = T_2' = T_3'$ is present in the waveform 201. FIG. 30b shows a waveform 202 of a sputtering power which is supplied from the power amplifier 47 to the electrode support 32 in synchronism with the current waveform 201, and the waveform 202 is varied stepwise similarly to the current waveform 201. Though the relation $T_1' = T_2' = T_3'$ is present in the waveforms shown in FIGS. 30a and 30b, each of $T_1'$, $T_2'$ and $T_3'$ may take any value within a range allowed in a sputtering apparatus. In this case, a waveform of the sputtering power and a current waveform supplied to the outer exciting coil 25 are appropriately controlled by the MPU 41 so that a film having an optimum thickness distribution and an optimum erosion area on a planar target plate is obtained.

In the above-mentioned examples, the current flowing through the outer exciting coil winding 25 is controlled. Alternatively, the current flowing through the inner exciting coil winding 24 may be controlled. In this case, the inner exciting coil 24 is supplied with a current waveform that is, a static dc, which is obtained by turning upside down the current waveform shown in each of FIGS. 28a, 29a and 30a, and the same effect as in the above-mentioned examples is obtained.

Incidentally, the output of the output power detecting part 49 shown in FIG. 13 is fed back so that the difference between the output power of the amplifier and the value given by D-A Converter 47 is inputted to the power amplifier 48, forming a negative feed back circuitry in order to put out a precise controlled power to the electrode support 32.

Further, the shield 30 is grounded, and a sputtering power is supplied between the upper end of the shield 30 and the planar target plate. Accordingly, when the sputtering power supplied between the shield 30 and planar target plate 21 is increased, the number of argon ions which are generated by glow discharge and bombard the planar target plate 21, is increased, and thus the amount of sputtered material is also increased.

As has been explained in the foregoing description, in the conventional sputtering cathode structure for planar magnetron sputtering apparatuses, erosion is locally generated at a very narrow region on the surface of a planar target plate. Accordingly, the life of the planar target plate is short and the thickness of a deposited film is not able to be kept uniform for long time period, due to the shape of erosion region.

On the other hand, according to the sputtering cathode structure of the present invention and the abovementioned method of controlling magnetic flux in this sputtering cathode structure, all of the drawbacks of the prior art can be eliminated. That is, a ring-shaped plasma region can be swung over a wider region of a planar target plate, and moreover a sputtering power can be controlled in synchronism with the swing of the ring-shaped plasma region. Thus, the life of planar target plate is increased, and not only a film having a uniform thickness but also a film having a given thickness distribution can be obtained. Accordingly, the present invention will play an important role in the attainment of a high performance which will be required for planar magnetron sputtering apparatuses.

We claim:

1. A cathode structure for planar magnetron sputtering apparatuses comprising:
    a target plate made of a material to be sputtered and having first and second main surfaces, said first main surface of said target plate facing a main surface of a sample substrate with a predetermined spacing therebetween, said material being deposited on said main surface of said sample substrate;
    magnetic flux generating means provided on the side of said second main surface of said target plate for generating magnetic flux having a certain flux density and a certain distribution in an empty space between said sample substrate and said first main surface of said target plate, said magnetic flux generating means including main magnetic flux generating means and magnetic flux distribution control means in such a manner that said main magnetic flux generating means and said magnetic flux distribution control means form a united magnetic flux source, said main magnetic flux generating means including one or a plurality of first pole portions and one or a plurality of first magnetic flux path means, said magnetic flux distribution control means including a plurality of second pole portions and a plurality of second magnetic flux path means, one end of said one or a plurality of first pole portions lying in close vicinity to or being kept in contact with said second main surface of the target plate with a predetermined magnetic polarity, the other end of the one or a plurality of first pole portions being kept in contact with and magnetically connected to said first magnetic flux path means, one end of each of said second pole portions lying in close vicinity to or being kept in contact with said second main surface of the target plate, the other end of each second pole portion being kept in contact with and magnetically connected to said second magnetic flux path means, said first magnetic flux path means and said second magnetic flux path means being magnetically connected to each other, thereby said magnetic flux density and said magnetic flux distribution formed in said empty space by said magnetic flux generating means being controlled by said magnetic flux control means; and electric field applying means having first and second electrodes and a power source for establishing an electric field in said empty space, said first electrode being provided on the side of said second main surface of the target plate in such a manner that said first electrode lies in close vicinity to or is kept in contact with said second main surface, said second electrode being provided in said empty space and spaced apart from said first electrode, said power source supplying electric power to said first and second electrodes.

2. A cathode structure according to claim 1, wherein a main part of said first and second pole portions has a cylinder form having a thick wall, and said first and second magnetic flux path means are formed of a common disc-shaped member which is made of a high permeability magnetic material and whose main portion has the form of a disc.

3. A cathode structure according to claim 2, wherein part of the plurality of second pole portions for forming said magnetic flux distribution control means is arranged in an outer peripheral region of said main magnetic flux generating means.

4. A cathode structure according to claim 2, wherein part of the plurality of second pole portions for forming said magnetic flux distribution control means is arranged inside said main magnetic flux generating means.

5. A cathode structure according to claim 2, wherein part of the plurality of second pole portions for forming said magnetic flux distribution control means is arranged in an outer peripheral region of said main magnetic flux generating means, and all or part of the remaining second pole portions is arranged inside said main magnetic flux generating means.

6. A cathode structure according to any one of claims 3 through 5, wherein part of the plurality of second pole portions for forming said magnetic flux distribution control means is arranged within a region in which the plurality of first pole portions for forming said main magnetic flux generating means are arranged.

7. A cathode structure according to any one of claims 1 through 5, wherein said one or a plurality of first pole portions for forming said main magnetic flux generating means are each formed of a permanent magnet.

8. A cathode structure according to any one of claims 1 through 5, wherein said one or a plurality of first pole portions for forming said main magnetic flux generating means are each formed of a united structure of a pole piece made of a high permeability magnetic material and an exciting coil disposed in the proximity of said pole piece.

9. A cathode structure according to any one of claims 1 through 5, wherein part of the plurality of first pole portions for forming said main magnetic flux generating means is formed of a permanent magnet, and the remaining first pole portion is formed of a united structure of a pole piece made of a high permeability magnetic material and an exciting coil disposed in the proximity of said pole piece.

10. A cathode structure according to any one of claims 1 through 5, wherein the plurality of first pole portions for forming said main magnetic flux generating means are divided into three groups, a first one of which is formed of a permanent magnet, a second one of which is formed of a united structure of a pole piece made of a high permeability magnetic material and an exciting coil disposed in the proximity of said pole piece, and a third one of which is formed of a pole piece made of a high permeability magnetic material.

11. A cathode structure according to any one of claims 1 through 5, wherein each of a plurality of second pole portions for forming said magnetic flux distribution control means is formed of a permanent magnet.

12. A cathode structure according to any one of claims 1 through 5, wherein each of the plurality of second pole portions for forming said magnetic flux distribution control means is formed of a united structure of a pole piece made of a high permeability magnetic material and an exciting coil disposed in the proximity of said pole piece.

13. A cathode structure according to any one of claims 1 through 5, wherein part of the plurality of second pole portions for forming said magnetic flux distribution control means is formed of a permanent magnet, and the remaining second pole portion is formed of a united structure of a pole piece made of a high permeability magnetic material and an exciting coil disposed in the proximity of said pole piece.

14. A cathode structure according to any one of claims 1 through 5, wherein part of the plurality of second pole portions for forming said magnetic flux distribution control means is formed of a united structure of a pole piece made of a high permeability magnetic material and an exciting coil disposed in the proximity of said pole piece, and the remaining second pole portion is formed of a pole piece made of a high permeability magnetic material.

15. A cathode structure according to any one of claims 1 through 5, wherein the plurality of second pole portions for forming said magnetic flux distribution control means are divided into three groups, a first one of which is formed of a permanent magnet, a second one of which is formed of a united structure of a pole piece made of a high permeability magnetic material and an exciting coil disposed in the proximity of said pole piece, and a third one of which is formed of a pole piece made of a high permeability magnetic material.

16. A method of controlling magnetic flux in a cathode structure for planar magnetron sputtering apparatuses, said cathode structure including: a target plate made of a material to be sputtered and having first and second main surfaces, said first main surface of said target plate facing a main surface of a sample substrate with a certain spacing therebetween, said material to be sputtered being deposited on said main surface of said sample substrate; and magnetic flux generating means provided on the side of said second main surface of said target plane for generating magnetic flux having a certain flux density and a certain distribution in an empty space between said sample substrate and said first main surface of said target plate, said magnetic flux generating means including main magnetic flux generating means and magnetic flux distribution control means in such a manner that said main magnetic flux generating means and said magnetic flux distribution control means form a united magnetic flux source, said main magnetic flux generating means including one or a plurality of first pole portions and one or a plurality of first magnetic flux path means, said magnetic flux distribution control means including a plurality of second pole portions and a plurality of second magnetic flux path means including an exciting coil which forms a united structure together with a pole piece provided in the proximity of said exciting coil and made of a high permeability magnetic material, one end of said one or a plurality of first pole portions lying in close vicinity to or being kept in contact with said second main surface of the target plate, the other end of the one or a plurality of first pole portions being magnetically connected to said first magnetic flux path means including a high permeability magnetic material, one end of said second pole portions lying in close vicinity to or being kept in contact with said second main surface of the target plate, the other end of the second pole portions being magnetically connected to said second magnetic flux path means made of a high permeability magnetic material, said first magnetic flux path means and said second magnetic flux path means being magnetically connected to each other, thereby a magnetic flux distribution formed in said empty space by said main magnetic flux generating means being controlled by said magnetic flux distribution control means, said method of controlling magnetic flux comprising a step of causing a magnetic flux control current to flow through said exciting coil.

17. A method of controlling magnetic flux according to claim 16, wherein a magnetic flux distribution formed in said empty space on the side of said first main surface of the target plate is controlled by a static, magnetic flux control current flowing through said exciting coil so that a plasma region formed dependently on said magnetic flux distribution by the ionization of a gas is statically extended in a planar form and covers said main surface of said sample substrate.

18. A method of controlling magnetic flux according to claim 16, wherein a magnetic flux distribution formed in said empty space on the side of said first main surface of the target plate is controlled by a dynamic, magnetic flux control current flowing through said exciting coil so that a plasma region formed dependently on said magnetic flux distribution by the ionization of a gas moves with time above said main surface of said sample substrate and periodically covers said main surface of said sample substrate.

19. A method of controlling magnetic flux according to claim 18, wherein said dynamic, magnetic flux control current flowing through said exciting coil is a current of a periodic function type having a predetermined amplitude and a predetermined period.

20. A method of controlling magnetic flux according to claim 19, wherein said current of a periodic function type having a predetermined amplitude and a predetermined period is a current having the waveform of a sinusoidal function.

21. A method of controlling magnetic flux according to claim 19, wherein said current of a periodic function type having a predetermined amplitude and a predetermined period is a current having the waveform of a composite function made up of a plurality of sinusoidal functions.

22. A method of controlling magnetic flux according to claim 19 or 21, wherein said current of a periodic function type having a predetermined amplitude and a predetermined period is a current having a sawtooth waveform, namely, a triangular waveform.

23. A method of controlling magnetic flux according to claim 19 or 21, wherein said current of a periodic function type having a predetermined amplitude and a predetermined period is a current having a square waveform, that is, having the waveform of a rectangular pulse train.

24. A method of forming a film in a planar magnetron sputtering apparatus provided with a cathode structure having a united magnetic flux source including at least three pole pieces and at least two magnetic field generating means, at least one of which is an electromagnet, said three pole pieces and said at least two magnetic field generating means being magnetically coupled to generate a concentric field distribution, said method comprising a step of causing a current having a predetermined period to flow through said electromagnet to move a ring-shaped plasma region at least one cycle in said predetermined period, whereby deposited layers corresponding to a plurality of positions of said ring-shaped plasma region form a film.

25. A method of forming a film according to claim 24, wherein when said ring-shaped plasma region is moved to vary the size of said ring-shaped plasma region to be at least large and small, a time during which said ring-shaped plasma region is large is longer than a time during which said ring-shaped plasma region is small.

26. A method of forming a film in a planar magnetron sputtering apparatus provided with a cathode structure provided with a united magnetic flux source incuding at least three pole pieces, at least two magnetic field generating means, at least one of which is an electromagnet, and means for supplying a current to said electromagnet, said three pole pieces and said two magnetic field generating means being magnetically coupled to generate a controllable magnetic flux distribution, said method comprising a step of supplying a current having a predetermined period from said current supplying means to said electromagnet to move a plasma region to a plurality of positions at least one cycle at said predetermined period, whereby deposited layers corresponding to the plurality of positions of said plasma region form a film.

27. A method of forming a film according to claim 26, wherein said electromagnet is arranged outside the other magnetic field generating means.

28. A method of forming a film according to claim 26 or 27, wherein said current supplying means supplies a square wave current in which a time said current takes a high level is longer than a time said current takes a low level.

29. A method of forming a film according to claim 26, wherein said cathode structure includes, as said magnetic field generating means, at least two electromagnets arranged concentrically.

30. A method of forming a film in a planar magnetron sputtering apparatus provided with a cathode structure having sputtering power source and having a united magnetic flux including at least three pole pieces and at least two magnetic field generating means, at least one of which is an electromagnet, the three pole pieces and the two magnetic field generating means being magnetically coupled to generate a concentric magnetic flux distribution, said method comprising a step of causing a current having a predetermined period to flow through said electromagnet, and simultaneously varying a sputtering power in synchronism with said current to vary the amount of a material sputtered while moving a ring-shaped plasma region to a plurality of positions at least one cycle in said predetermined period, whereby deposited layers corresponding to a plurality of positions of said annular plasma region form a film.

31. A method of forming a film in a planar magnetron sputtering apparatus provided with a cathode structure including a target plate, at least three pole pieces, at least two magnetic field generating means, at least one of which is an electromagnet, means for supplying a current having a predetermined period to said electromagnet, and means for controlling a sputtering power supplied to said target plate, said three pole pieces and said two magnetic field generating means being magnetically coupled to form a united magnetic flux source, said method comprising a step of varying said sputtering power supplied from said control means in synchronism with said current to vary the amount of a material sputtered from said target plate while moving a plasma region to a plurality of positions at least one cycle in said predetermined period, whereby deposited layers corresponding to a plurality of positions of said plasma region form a film.

32. A sputtering cathode structure adapted for use in a planar magnetron sputtering apparatus comprising:
at least two magnet means for generating magnetic flux, including at least one electromagnet coil to be energized by a controlled current source;
means for magnetically coupling said at least two magnet means to form an integrated magnetic flux source together with said at least two magnet means, including a magnetic member bridging said at least two magnet means and formed of a soft magnetic material, and said at least two magnet means being disposed on one side of the magnetic coupling means;
means for supplying a controlled current to said at least one electromagnet coil for generating controlled magnetic flux, thereby controlling the distribution of magnetic flux at least in the neighborhood of said integrated magnetic flux source.

33. A sputtering cathode structure according to claim 32, wherein said soft magnetic material has a magnetic permeability greater than about 100.

34. A sputtering cathode structure according to claim 32, wherein said magnetic coupling means includes a magnetic enclosure magnetically coupled with said magnetic member and surrounding said at least two magnet means.

35. A sputtering cathode structure according to claim 34, wherein a first one of said at least two magnet means surrounds a second one of said at least two magnet means.

36. A sputtering cathode structure according to claim 35, wherein said first one of said at least two magnet means comprises said at least one electromagnet coil.

37. A sputtering cathode structure according to claim 36, wherein said first one of said at least two magnet means comprises an intermediate magnetic member formed of a soft magnetic material and surrounding said second one of said at least two magnet means and said at least one electromagnet coil wound around said intermediate magnetic member, inside said magnetic enclosure.

38. A sputtering cathode structure according to claim 35, wherein said second one of said at least two magnet means comprises said at least one electromagnet coil.

39. A sputtering cathode structure according to claim 38, wherein said second one of said at least two magnet means comprises a central magnetic member formed of a soft magnetic material and said at least one electromagnet coil wound around said central magnetic member.

40. A sputtering cathode structure according to any one of claims 34 to 37, further comprising;

a cathode body formed of a non-magnetic material and disposed in the vicinity of said magnetic coupling means on the other side of said magnetic coupling member.

* * * * *